United States Patent [19]
Sukegawa

[11] Patent Number: 5,487,039
[45] Date of Patent: Jan. 23, 1996

[54] SEMICONDUCTOR MEMORY DEVICE

[75] Inventor: Shunichi Sukegawa, Oume, Japan

[73] Assignee: Texas Instruments Incorporated, Dallas, Tex.

[21] Appl. No.: 69,221

[22] Filed: May 28, 1993

[30] Foreign Application Priority Data

May 28, 1992 [JP] Japan .................................. 4-162244

[51] Int. Cl.$^6$ .................................................. G11C 7/00
[52] U.S. Cl. .................... 365/200; 365/230.03; 371/10.3
[58] Field of Search .............................. 365/200, 225.7, 365/201, 230.03; 371/10.2, 10.3

[56]  References Cited

U.S. PATENT DOCUMENTS

| | | | |
|---|---|---|---|
| 4,987,560 | 1/1991 | Hamano et al. ........................ | 365/200 |
| 5,195,057 | 3/1993 | Kasa et al. ............................. | 365/200 |
| 5,386,386 | 2/1995 | Ogihara .................................. | 365/200 |

Primary Examiner—Tan T. Nguyen
Attorney, Agent, or Firm—William E. Hiller; Richard L. Donaldson

[57]  ABSTRACT

A semiconductor memory device with a redundant circuit architecture having improved repairing efficiency and improved yield comprising a memory array (1) divided between a number of subarrays, in which a number of memory cells MCL are arrayed in matrix form; circuits (6–8) and (11–13), which select the subarrays SUB0–SUB7 based on the address signal in order to drive the cell with the specified address; a number of spare word sets SWLS, situated to correspond to the subarrays SUB0–SUB7; a number of fuse sets (3A), which are situated to correspond to the spare word sets SWLS, and which output signals used to replace the selection drive circuit being driven with a spare word set SWLS; and a circuit (3A), used to switch as desired between the output lines for the output signals of the fuse sets; wherein the aforementioned output lines are installed to correspond to the spare word sets (SWLS), and the selection and drive circuits are allowed to select the subarrays SUB0–SUB7 corresponding to the output lines.

9 Claims, 11 Drawing Sheets

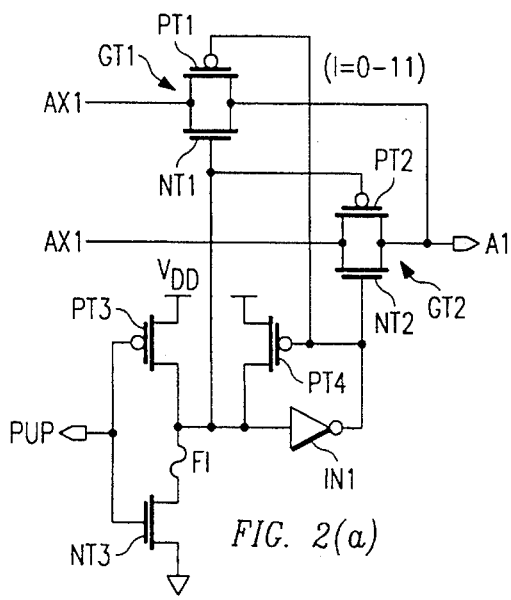
FIG. 2(a)
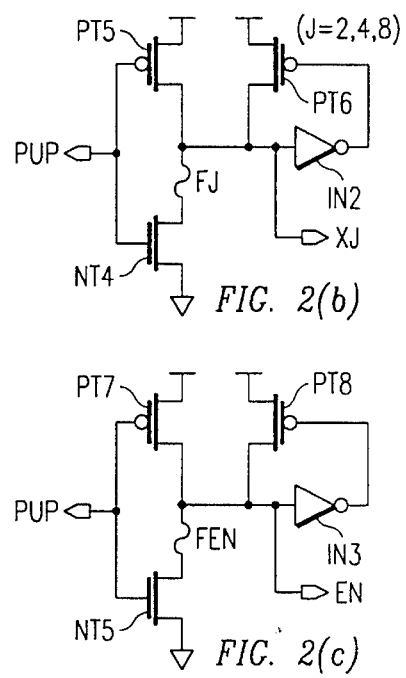
FIG. 2(b)
FIG. 2(c)
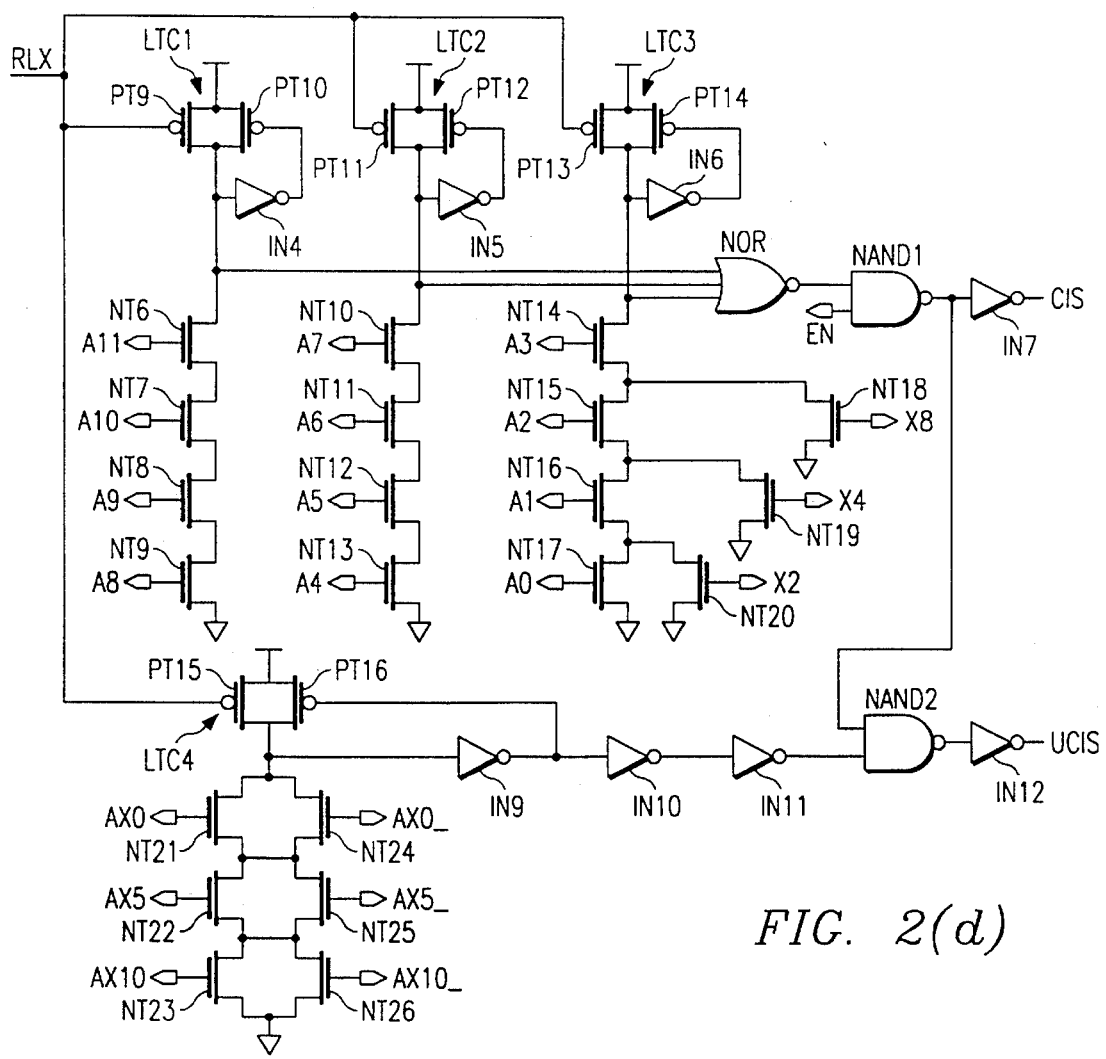
FIG. 2(d)

SEMICONDUCTOR MEMORY DEVICE

FIELD OF THE INVENTION

The present invention pertains to a semiconductor memory device, and pertains in particular to a semiconductor memory device having redundant circuitry which is used to repair defects in a memory element.

BACKGROUND OF THE INVENTION

Memory devices, especially semiconductor memory devices which store digital data and read that data as necessary for outputting to external devices, have been used in a wide variety of fields and have become indispensable components as advances have been made in recent years in creating digital versions of various types of equipment.

Semiconductor memory devices have increased in capacity, and the level of integration on memory chips has also increased with advances in fine processing technologies in recent years.

The highly integrated semiconductor memory devices mentioned above are designed around memory cells, which are the smallest unit of storage. Unit cells, which are elements that store one of two values (low level or high level), are arrayed in a regular manner in the horizontal (row) direction and the vertical (column) direction on a plane. Thus, they are set in what is referred to as a matrix array.

With this type of memory array, memory cells in the row direction are selected according to the word line. The selection of a word line is carried out by a horizontal decoder (row decoder) after receiving row address input signals from the outside. When a group of memory cells aligned in the column direction is selected according to a word line, the data in the aforementioned memory cells is transferred to a bit line. In addition, each bit line is connected, for example, to a sensing amplifier, used to amplify the signals.

As described above, as memory capacity increases with advances in size reduction technology, the number of memory cells connected to a single bit line increases tremendously. As a result, the sensitivity of the sensing amplifier is adversely affected.

In relation to this, in recent years, highly integrated semiconductor memory devices have been structured to comprise a number of sensing amplifiers, with the memory array divided. Row decoders and sensing amplifiers are thus installed for each subarray unit and are used in storing and reading data.

In addition, with the increase in storage capacity, it has become more difficult to maintain the manufacturing yield for memory chips at a practical level.

For these reasons, one means which has been used to repair defective memory cells, which are a primary cause of the aforementioned decrease in yield, is to equip each subarray in advance with spare memory cells which can be substituted for the defective memory cells in the circuitry. This type of design is referred to as redundant circuitry architecture. The unit which is to be repaired is a memory cell alignment (line) in a single row or a single column along the word line or bit line.

FIG. 9 is a diagram which illustrates the basic concepts behind the redundant circuitry architecture used with conventional highly integrated semiconductor memory devices.

In the example shown, the memory array is divided into eight subarrays.

In the figure, SUB0, SUB1, SUB2, SUB3, SUB4, SUB5, SUB6, and SUB7 are subarrays. $F_0$, $F_1$, $F_2$, $F_3$, $F_4$, $F_5$, $F_6$, and $F_7$ are repairing circuits installed to correspond to the subarrays SUB0, SUB1, SUB2, SUB3, SUB4, SUB5, SUB6, and SUB7. In addition, WL0, WL1, WL2, WL3, WL4, WL5, WL6, and WL7 are word lines, and SWL0, SWL1, SWL2, SWL3, SWL4, SWL5, SWL6, and SWL7 are spare word lines. In addition, each of the subarrays SUB0, SUB1, SUB2, SUB3, SUB4, SUB5, SUB6, and SUB7 is provided with a corresponding row decoder RWD0, RWD1, RWD2, RWD3, RWD4, RWD5, RWD6, and RWD7, and sensing amplifier SNS0, SNS1, SNS2, SNS3, SNS4, SNS5, SNS6, and SNS7.

The process of substituting spare word lines for word lines which contain defective memory cells via the repairing circuits $F_0$, $F_1$, $F_2$, $F_3$, $F_4$, $F_5$, $F_6$, and $F_7$ is carried out by registering the defective address in the spare decoder, which selects the spare word line. Specific registration means which can be used include electrically blowing the fuse, or blowing the fuse with a laser.

With this type of redundant circuit, if a defective row or memory cell is contained in the memory arrangement in, for example, the subarray SUB0, then that defect is repaired by substituting in the spare word line SWL0 using the repairing circuit $F_0$.

However, with the above redundant circuit, since repairing circuits and spare word lines are installed for each subarray, creating a one-to-one correspondence between the repairing circuits and the subarrays, it is not possible to use one repairing circuit to repair a defect in a different subarray, which is problematic in that the efficiency of the repairing operation is low.

In addition, when a memory chip is designed such that the memory array is divided into a number of subarrays as described above, the yield will be determined according to the number of spare word lines contained in the subarrays. Thus, with conventional redundant circuit structures, in which word lines are set and repairing circuits are installed for each subarray, as the number of subarrays is increased, the number of spare word lines is also increased, which is problematic in that the yield declines accordingly.

This issue will now be discussed in further detail.

The present case will focus on the dependence of the yield on surface area, assuming that the defect density D of a word line is $20/cm^2$.

In this case, the yield for each surface area is calculated based on the Poisson distribution function shown in the formula below. The probability P(n) of the occurrence of a number n of defects in an area A is expressed in the following formula.

(Formula 1)

$$P(n) = (AD)^n e^{-(AD)}/n!$$

Thus, the probability Q(n), whereby a number n or less of defects may occur, is determined according to the following formula.

$$Q(n) = \sum_{n=0}^{n} P(n) \qquad \text{(Formula 2)}$$

In this case, as shown in FIG. 10, it is assumed that there are 16 repairing circuits contained in the memory cell area A. The following are examples of correspondence between the repairing circuits and the memory cell area A.

a: 16 repairing circuits in A as a whole
b: 8 repairing circuits×2 in (½) A
c: 4 repairing circuits×4 in (¼) A
d: 2 repairing circuits×8 in (⅛) A
e: 1 repairing circuits×16 in (1/16) A Based on the above hypotheses, it is possible to calculate the yield for the memory cell area A in the corresponding examples (a–e), based on the Poisson distribution function. The probability P(n), whereby a number n of defects may occur in the area A, is expressed according to Formula (1) described above.

Thus, the yield Pa in the memory cell area A for the example in (a) can be expressed as shown in Formula (3) based on the aforementioned Formula (2), since it indicates the probability that 16 or less defects will occur in A.

$$Pa = \left( \sum_{n=0}^{16} (AD)^n e^{-(AD)}/n! \right) \quad \text{(Formula 3)}$$

In addition, the yield Pb for the memory cell area A in the example in b is expressed by the following formula.

$$Pb = \left( \sum_{n=0}^{8} ((1/2)AD)^n e^{-(AD)}/n! \right)^2 \quad \text{(Formula 4)}$$

In addition, the yields Pc, Pd, and Pe in the memory cell area A for the examples in c–e can be respectively expressed by the following formulas.

$$Pc = \left( \sum_{n=0}^{4} ((1/4)AD)^n e^{-(AD)}/n! \right)^4 \quad \text{(Formula 5)}$$

$$Pd = \left( \sum_{n=0}^{2} ((1/8)AD)^n e^{-(AD)}/n! \right)^8 \quad \text{(Formula 6)}$$

$$Pe = \left( \sum_{n=0}^{1} ((1/16)AD)^n e^{-(AD)}/n! \right)^{16} \quad \text{(Formula 7)}$$

FIG. 11 is a graph which illustrates yield with respect to defect density in each of the examples a–e described above. Defect density is presented on the horizontal axis, and yield is presented on the vertical axis.

As FIG. 11 makes clear, it is possible to obtain a higher yield by relating the repairing circuits to the area as a whole, than by relating them to e divided area.

Thus, with redundant structures such as that shown in FIG. 9, yield is determined according to the number of spare word lines contained in each subarray.

FIG. 12 is a graph which illustrates the calculation results for a case in which 1−Q(n) is taken as row yield. In the figure, the number of spare (redundant) word lines is shown on the horizontal axis, and the yield is shown on the vertical axis.

In addition, the corresponding surface areas are as shown in Table I below.

TABLE I

| Blocks | Area |
| --- | --- |
| Block A (1 subarray) | 0.0105 cm² |
| Block 8 (8 subarrays) | 0.084 cm² |
| Block 16 (16 subarrays) | 0.168 cm² |
| Block 32 (32 subarrays) | 0.336 cm² |
| Block 128 (128 subarrays) | 1.344 cm² |

It should be noted that in the graph shown in FIG. 12, a borderline is drawn at 90%. The numerals shown on the top of each curve denote the number of spare word lines, corresponding to the given area, which are required for yield to exceed 90% when the defect density D=20/cm².

The numbers of spare word lines shown in FIG. 12 which are required for yield to exceed 90% when defect density D=20/cm² are as shown below in Table II.

TABLE II

| Blocks | Required number of spare word lines | Actual number of spare word lines |
| --- | --- | --- |
| Block A (1 time) | 1 | 1 |
| Block 8 (8 times) | 3 | 8 |
| Block 16 (16 times) | 6 | 16 |
| Block 32 (32 times) | 10 | 32 |
| Block 128 (128 times) | 34 | 128 |

As FIG. 12 and Table II make clear, an increase in the number of blocks, i.e., an increase in the number of subarrays, causes an increase in the value of (required number of spare word lines)/(actual number of spare word lines). Thus, the number of unnecessary spare word lines increases.

Specifically, in memory chips divided into a number of subarrays, as shown in FIG. 9, redundant circuits, which comprise. repairing circuits and spare word lines for each subarray such that the repairing circuits and subarrays have a one-to-one correspondence, cause the memory chip yield to be determined according to the number of spare word lines contained in the subarray.

Thus, the conventional redundant architecture shown in FIG. 9 results in poor efficiency in the repairing operation.

The present invention has been developed in light of the above conditions, and has the objective of providing a semiconductor memory device which is very efficient in repairing defects, thus making it possible to improve yield.

SUMMARY OF THE INVENTION

In order to achieve the above objective, the present invention is designed to comprise the following: a number of subarrays, designed such that a number of memory cells, arrayed in matrix form, are selectively driven according to address signals; a number of spare sets comprising spare memory cells, which are installed to correspond to the aforementioned subarrays; a short circuit element set, which selects the spare memory cells contained in the spare sets in place of the memory cells contained in the aforementioned subarray; and a circuit which, in response to the aforementioned address signal, selectively drives the spare memory cells according to the selection status of the aforementioned short circuit element set.

With the present invention, if a memory cell contains no defect, and the short circuit element in the short circuit element set is not disconnected, then when an address signal is inputted, a subarray is selected accordingly, thereby driving a memory cell consisting of 1 row or 1 column, as specified by the address.

Under these conditions, if a defect occurs in a memory cell, etc., then a certain short circuit element set is selected, and the corresponding short circuit element is disconnected.

As a result, in response to the address signal, spare memory cells are selectively driven according to the selection status of the short circuit element set.

BRIEF DESCRIPTION OF THE DRAWINGS

FIGS. 2(a), 2(b) and 2(c) are respective circuit diagrams of different fuse circuits as included in a fuse set as a component of the semiconductor memory device of the present invention.

FIG. 2(d) is a schematic diagram which shows a specific example of the fuse set array in FIG. 1(a).

DESCRIPTION OF THE PREFERRED EMBODIMENTS

Figure 1A:
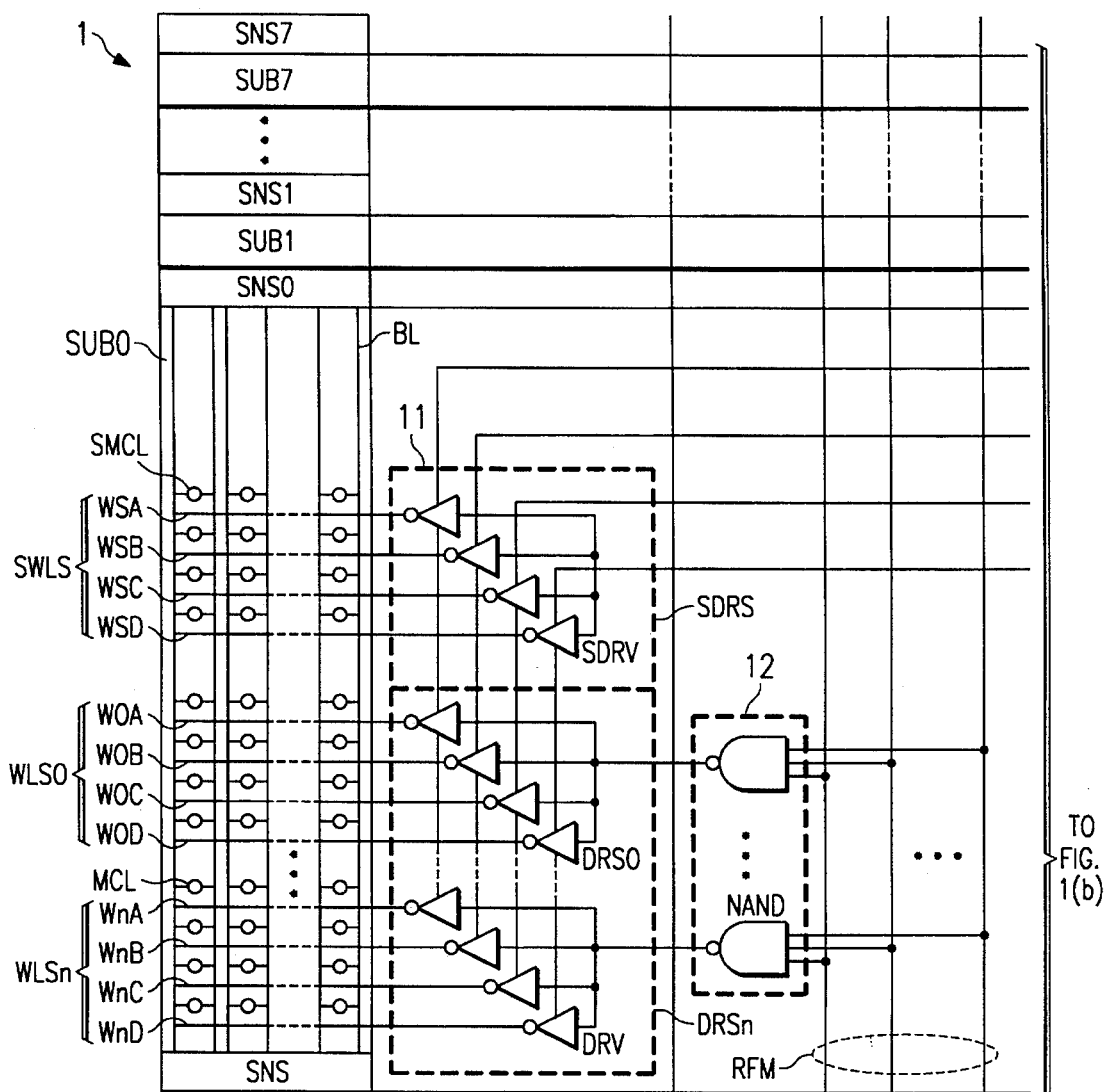
FIGS. 1(a) and (b) are portions of a schematic diagram which shows a first embodiment of the semiconductor memory device of the present invention.
Figure 1A:
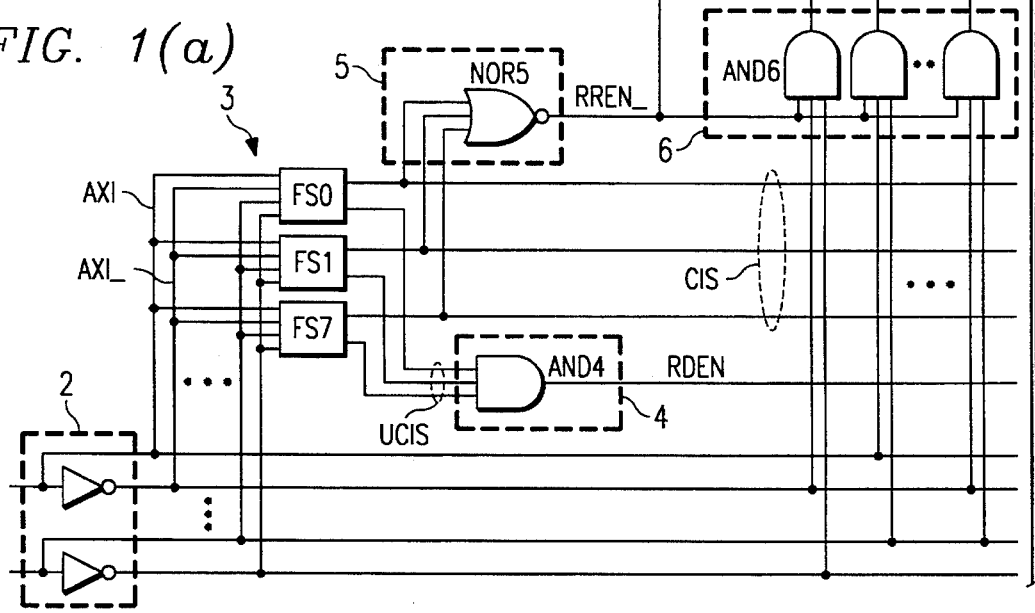
Figure 1B:
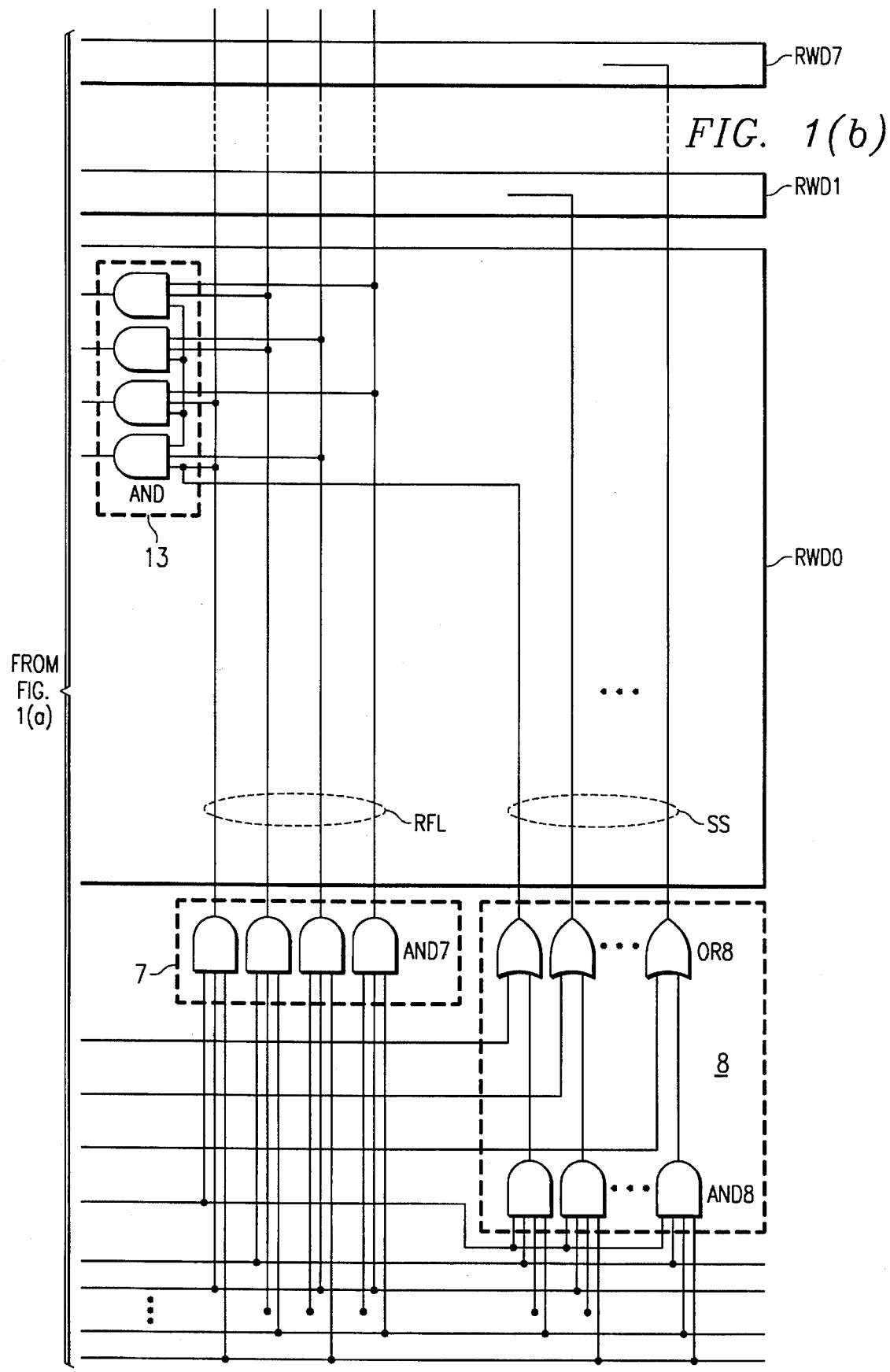

FIGS. 1(a) and 1(b) are portions of a schematic diagram which shows a preferred embodiment of the semiconductor memory device of the present invention. In FIGS. 1(a) and 1(b), (1) is a memory array; (2) is an address input unit; (3) is a fuse set array; (4) is a row decoder enable signal generating unit; (5) is a redundancy enable signal generating unit; (6) is an address middle signal generating unit; (7) is an address low signal generating unit; and (8) is a subarray selection signal generating unit.

The memory array (1) is designed such that memory cells MCL, which are the smallest unit in the memory, are arrayed in matrix form to have N rows and M columns. In addition, it is divided into eight subarrays SUB0, SUB1 . . . , SUB7. Each of the aforementioned subarrays SUB0, SUB1 . . . , SUB7 comprises a row decoder RWD0, RWD1 . . . , RWD7 and a sensing amplifier SNS0, SNS1 . . . , SNS7.

As shown in FIG. 1(a), each of the subarrays SUB0–SUB7 comprises 4 (n+2)×M memory cells MCL, 4 (n+2) word lines WL, and 2×M bit lines BL. Each of the bit lines BL is connected to a corresponding sensing amplifier SNS0–SNS7.

In further detail, in the usual memory area, there are four contiguous word lines W0A–W0D, W1A–W1D . . . , WnA–WnD, each of which comprises a single word set, forming (n+1) word sets WLS0–WLSn. In addition, a spare word set SWLS, composed of four spare word lines WSA–WSD which contain spare memory cells SMCL, is installed to correspond to one of the word sets.

Each of the row decoders RWD0–RWD7 comprises the following: a word line driver (11), an address middle signal decoder (12), and an address low signal decoder (13).

In the word line driver (11), a driver DRV is connected to each word line. Four drivers DRV form a single set. These are then arranged as driver sets DRS0–DRSn, which correspond to the individual word sets WLS0–WLSn.

In the same manner, in the spare memory area, four spare drivers SDRV form a single set. This is then arranged as a spare driver set SDRS, which corresponds to the spare word set SWLS. Each of the spare drivers SDRV is connected to a corresponding spare word line WSA–WSD.

The drivers DRV in the driver sets DRS0–DRSn in the usual memory area are selected and driven according to the output of the address middle signal decoder (12) and the output of the address low signal decoder (13).

In contrast, the spare driver SDRV in the spare driver set SDRS in the spare memory area is selected and driven according to a redundancy enable signal RREN_ (REDUNDANCY ENABLE), generated by the redundancy enable signal generating unit (5), and the output of the address low signal decoder (13).

The address middle signal decoder (12) is structured such that NAND gates, in a number equal to the number of driver sets DRS0DRSn, i.e., in a number equal to (n+1), are arrayed in parallel. Each of the NAND gates receives as input an address middle signal RFM (ADDRESS FACTOR MIDDLE), which is generated by the address middle generating unit (6). The corresponding negative logical product results are outputted to the corresponding driver sets DRS0–DRSn.

The address low signal decoder (13) is structured such that AND gates, in a number equal to the number of drivers DRV or SDRV (which form the corresponding driver sets DRS0–DRSn or spare driver set SDRS), i.e., the number four, are arrayed in parallel. Each of the AND gates receives as input an address low signal RFL (ADDRESS FACTOR LOW), generated by the address low signal generating unit (7), and a subarray selection signal SS (SUBARRAY SELECT), generated by the subarray selection signal generating unit (8). The logical product results are outputted to the corresponding drivers DRV and the spare drivers SDRV.

The address input unit (2) receives address signals as input from the outside. It inverts some of the input levels, then outputs the results, in the form of address signals AXI and AXI_, to the fuse set array (3), the address middle signal generating unit (6), the address low signal generating unit (7), and the subarray selection signal generating unit (8).

In the fuse set array (3), eight fuse sets FS0, FS1 . . . , FS7, which consist of coincidence circuits having the structure shown in FIG. 2(d), are arrayed in parallel. Each fuse set FS0–FS7 receives as input the output of the address input unit (2). In the present example, the number of fuse sets (8) is set to correspond to the total number of spare word sets SWLS installed in the subarrays SUB0–SUB7.

As shown in FIGS. 2(a), 2(b) and 2(c), each of the fuse sets FS0–FS7 comprises three different types of fuse circuits, such as FI (I=0–11), FJ (J=2,4,8), and FEN. Coincidence status or uncoincidence status for the input address is detected according to whether the fuses are blown or not blown, after which high-active coincidence signals CIS and high-active un-coincidence signals UCIS are outputted.

In the initial state, in which redundancy (the repairing operation) is not needed, the coincidence signal CIS is outputted with low-level inactive status, and the un-coincidence signal UCIS is outputted with high-level active status.

The structure shown in FIGS. 2(a)–2(d) will now be explained in further detail.

In FIGS. 2(a)–2(d), GT1 and GT2 are gate circuits. LTC1–LTC4 are latch circuits. PT1–PT16 are PMOS transistors. NT1–NT26 are NMOS transistors. IN1–IN7 and IN9–IN12 are inverters. NOR is a 3-input NOR gate. NAND1 and NAND2 are NAND gates. AXI and AXI__ are the output address signals of the address input unit (2) shown in FIG. 1(a). PUP is a power-up signal. RLX is a RAS clock signal.

FIGS. 2(a) and 2(b) show the address signal processing components. FIG. 2(c) shows the unit used to generate enable signals EN, which set the output unit of the coincidence signal CIS in FIG. 2(d) to the drive status when an defect is to be repaired. FIG. 2(d) shows the units used to generate coincidence signals CIS and un-coincidence signals UCIS. The outputs AI, XJ, and EN shown in FIGS. 2(a), 2(b), and 2(c) are connected to components denoted by the same numbers as in FIG. 2(d).

The address signal processing unit shown in FIG. 2(a) comprises the following: the gate circuits GT1 and GT2, PMOS transistors PT3 and PT4, an NMOS transistor NT3, the inverter IN1, and the fuse FI.

The gate circuit GTi is composed of the PMOS transistor PT1 and the NMOS transistor NT1. It receives the address signal AXI as input. In addition, the gate of the PMOS transistor PT1 receives a low-level signal as input, while the gate of the NMOS transistor NT1 receives a high-level signal as input. Next, the input signal AXI is outputted to AI.

The gate circuit GT2 is composed of the PMOS transistor PT2 and the NMOS transistor NT2. It receives the address signal AXI__ as input. In addition, the gate of the PMOS transistor PT2 receives a low-level signal as input, while the gate of the NMOS transistor NT2 receives a high-level signal as input. Next, an input signal AXI__ is outputted to AI.

The source of the PMOS transistor PT3 is connected to a source voltage $V_{DD}$. Its drain is connected to the following: one end of the fuse FI, the gate of tile NMOS transistor NT1 of the gate circuit GT1, the gate of the PMOS transistor PT2 of the gate circuit GT2, the drain of the PMOS transistor PT4, and the input of the inverter IN1. In addition, the source of the NMOS transistor NT3 is grounded, while its drain is connected to the other end of the fuse FI. Thus, the gates of the PMOS transistor PT3 and the NMOS transistor NT3 are both temporarily set to the low level when the power is turned on, after which they are connected to the signal line for the power-up signal PUP, which is maintained at the high level at all times.

In addition, the source of the PMOS transistor PT4 is connected to the source voltage $V_{DD}$. The output of the inverter IN1 is connected to the following: the gate of the PMOS transistor PT1 of the gate circuit GT1, the gate of the NMOS transistor NT2 of the gate circuit GT2, and the gate of the PMOS transistor PT4.

The address signal processing unit shown in FIG. 2(b) comprises the following: PMOS transistors PT5 and PT6, an NMOS transistor NT4, an inverter IN2, and a fuse FJ.

The source of the PMOS transistor PT5 is connected to the source voltage $V_{DD}$. Its drain is connected to the following: one end of the fuse FJ, the drain of the PMOS transistor PT6, and the input of the inverter IN2. In addition, the source of the NMOS transistor NT4 is grounded, while its drain is connected with the other end of the fuse FJ. Thus, the gates of the PMOS transistor PT5 and the NMOS transistor NT4 are both temporarily set to the low level when the power is turned on, after which they are connected to the signal line for the power-up signal PUP, which is maintained at the high level at all times.

In addition, the source of the PMOS transistor PT6 is connected to the source voltage $V_{DD}$, and its gate is connected to the output of the inverter IN2.

The enable signal generating unit shown in FIG. 2(c) comprises the following: the PMOS transistors PT7 and PT8, the NMOS transistor NT5, the inverter IN3, and the fuse FEN.

The source of the PMOS transistor PT7 is connected to the source voltage $V_{DD}$. Its drain is connected to the following: one end of the fuse FEN, the drain of the PMOS transistor PT8, and the input of the inverter IN3. In addition, the source of the NMOS transistor NT5 is grounded, while its drain is connected with the other end of the fuse FEN. Thus, the gates of the PMOS transistor PT7 and the NMOS transistor NT5 are both temporarily set to the low level when the power is turned on, after which they are connected to the signal line for the power-up signal PUP, which is maintained at the high level at all times.

In addition, the source of the PMOS transistor PT8 is connected to the source voltage $V_{DD}$, and its gate is connected to the output of the inverter IN3.

The coincidence/un-coincidence signal generating unit shown in FIG. 2(d) comprises the following: the latch circuits LTC1–LTC4, the NMOS transistors NT6–NT26, the inverters IN4–IN7 and IN9–IN12, the NOR gate, and the NAND gates (1) and (2). The latch circuit LTC1 comprises the PMOS transistors (9) and (10), and the inverter IN4. The latch circuit LTC2 comprises the PMOS transistors (11) and (12), and the inverter IN5. The latch circuit LTC3 comprises the PMOS transistors (13) and (14), and the inverter IN6. The latch circuit LTC4 comprises the PMOS transistors (15) and (16), and the inverter IN9.

Each of the latch circuits LTC1–LTC4 is connected in parallel to the RAS clock line RLX. More specifically, the RAS clock line RLX is connected to the following: the gate of the PMOS transistor PT9 of the latch circuit LTC1, the gate of the PMOS transistor PT11 of the latch circuit LTC2, the gate of the PMOS transistor PT13 of the latch circuit LTC3, and the gate of the PMOS transistor PT15 of the latch circuit LTC4.

The sources of the PT (9) and (10) of the latch circuit LTC1 are connected to the source voltage Vm, and the drains are connected to the following: the input of the inverter IN4, the drain of the NMOS transistor NT6, and one input of the 3-input NOR gate. The output of the inverter IN4 is connected to the gate of the PMOS transistor PT10.

The sources of the PT (11) and (12) of the latch circuit LTC2 are connected to the source voltage $V_{DD}$, and the drains are connected to the following: the input of the inverter IN5, the drain of the NMOS transistor NT10, and one input of the 3-input NOR gate. The output of the inverter IN5 is connected to the gate of the PMOS transistor PT12.

The sources of the PT (13) and (14) of the latch circuit LTC3 are connected to the source voltage $V_{DD}$, and the drains are connected to the following: the input of the inverter IN6, the drain of the NMOS transistor NT14, and one input of the 3-input NOR gate. The output of the inverter IN6 is connected to the gate of the PMOS transistor PT14.

The sources of the PT (15) and (16) of the latch circuit LTC4 are connected to the source voltage $D_{DD}$, and the drains are connected to the following: the input of the inverter IN9, and the drains of the NMOS transistors NT21 and NT24. The output of the inverter IN9 is connected to the gate of the PMOS transistor PT16 and the input of the inverter (10).

The source of the NMOS transistor NT6 is connected to the drain of the NMOS transistor NT7, and the source of the NMOS transistor NT7 is connected to the drain of the NMOS transistor NT8. The source of the NMOS transistor NT8 is connected to the drain of the NMOS transistor NT9, and the source of the NMOS transistor NT9 is grounded.

The source of the NMOS transistor NT10 is connected to the drain of the NMOS transistor NT11, and the source of the NMOS transistor NT11 is connected to the drain of the NMOS transistor NT12. The source of the NMOS transistor NT12 is connected to the drain of the NMOS transistor NT13, and the source of the NMOS transistor NT13 is grounded.

The source of the NMOS transistor NT14 is connected to the drain of the NMOS transistor NT15, and the source of the NMOS transistor NT15 is connected to the drain of the NMOS transistor NT16. The source of the NMOS transistor NT16 is connected to the drain of the NMOS transistor NT17, and the source of the NMOS transistor NT17 is grounded.

Each gate of the NMOS transistors NT6–NT17 receives as input the output of the address signal processing unit shown in FIG. 2(a).

The source of the NMOS transistor NT18 is grounded, and its drain is connected to the node between the source of the NMOS transistor (14) and the drain of the NMOS transistor (15).

The source of the NMOS transistor NT19 is grounded, and its drain is connected to the node between the source of the NMOS transistor (15) and the drain of the NMOS transistor (16).

The source of the NMOS transistor NT20 is grounded, and its drain is connected to the node between the source of the NMOS transistor (16) and the brain of the NMOS transistor (17).

The gates of the aforementioned NMOS transistors NT18, NT19, and NT20 are connected to the output of the signal processing unit shown in FIG. 2(b).

In addition, the sources of the NMOS transistors NT21 and NT24 are connected to the drains of the NMOS transistors NT22 and NT25. The sources of the NMOS transistors NT22 and NT25 are connected to the drains of the NMOS transistors NT23 and NT26, and the sources of the NMOS transistors NT23 and NT26 are grounded.

The gates of the aforementioned NMOS transistors NT21–NT26 receive, respectively as input, AX0, AX0_, AX5, AX5_, and AX10, AX10_, which are the output signals of the address signal input unit (2). The aforementioned NMOS transistors NT21–NT26 are configured so as to obtain the output timing of the un-coincidence signal UCIS.

In addition, the output of the 3-input NOR gate is connected to one input of the NAND gate (1), while the other input of the NAND gate (1) is connected to the output of the enable signal EN output unit in the enable signal generating unit shown in FIG. 2(c). The output of the NAND gate (1) is connected to the input of the inverter IN7 and to one input of the NAND gate (2). The coincidence signal CIS is outputted from the output of the inverter IN7.

In addition, the output of the inverter (10) is connected to the input of the inverter IN11, and the output of the inverter IN11 is connected to the other input of the NAND gate (2). The output of the NAND gate (2) is connected to the input of the inverter IN12, and the un-coincidence signal UCIS is outputted from the output of the inverter IN12.

The basic operation of the circuit shown in FIG. 2(d) will now be explained.

The following discussion pertains to a case in which a defective memory cell is not repaired.

In the address signal processing unit shown in FIG. 2(a), when the power is turned on, the gates of the PMOS transistor PT3 and the NMOS transistor NT3 receive as input power-up signal PUP, which remains at the low level for a fixed period of time, and then become the high level. This high-level status is maintained until the power is turned off.

In this case, if the fuse FI has not been blown, the output of the drain of the PMOS transistor PT3 is maintained at the low level. The aforementioned low-level signal is inputted to the gate of the NMOS transistor NT1 of the gate circuit GT1 and to the gate of the PMOS transistor PT2 of the gate circuit GT2. In addition, a high-level signal, obtained by inverting the level via the inverter IN1, is inputted to the following: the gate of the PMOS transistor PT1 of the gate circuit GT1, the gate of the NMOS transistor NT2 of the gate circuit GT2, and the gate of the PMOS transistor PT4.

As a result, the gate circuit GT1 is turned off, and the gate circuit GT2 is turned on. During this process, since the PMOS transistor PT4 is turned off, the gate circuit GT2 is maintained in the on state. Thus, the address signal AXI_ passes through the gate circuit GT2 and appears at the output AI. This output is then inputted to the gates of the NMOS transistors NT6–NT17 shown in FIG. 2(d).

In the same manner, in the address signal processing unit shown in FIG. 2(b), when the power is turned on, the gates of the PMOS transistor PT5 and the NMOS transistor NT4 receive as input power-up signal PUP, which remains at the low level for a fixed period of time, and then become the high level. This high-level status is maintained until the power is turned off.

During this process, if the fuse FJ has not been blown, the output of the drain of the PMOS transistor PT5 is maintained at the low level. The aforementioned low-level signal appears in the output XJ. In addition, a high-level signal, obtained by inverting the level via the inverter IN2, is inputted to the gate of the PMOS transistor PT6.

Thus, the PMOS transistor PT6 is maintained in the off state, and the output XJ of the aforementioned address signal processing unit is maintained at the low level. This output is then inputted to the NMOS transistors NT18–NT20 shown in FIG. 2(d).

The NMOS transistors NT18–NT20, to which the low-level XJ signal is inputted, are turned off. It should be noted that the aforementioned NMOS transistors NT18–NT20 are installed to enable the circuit to operate regardless of the values in the A0, A1, and A2 bits of the address.

If, for example, the fuse at J=2 is blown, then the output $F_2$ becomes the high level, and the NMOS transistor NT20 is turned on. Thus, the least significant bit A0 in the address is ignored as the circuit operates. If the fuse at J=4 is blown, then the two least significant bits A1 and A0 in the address will be ignored. If the fuse at J=8 is blown, then the three least significant bits A2, A1, and A0 in the address will be ignored.

When the aforementioned fuses at J=2, 4, and 8 are blown, defects in multiple neighboring bits are repaired. In the circuit shown in FIGS. 1(a) and 1(b), one of the subarrays contains a single spare word set. Since there are four word lines in a single spare word set, when the circuit shown in FIG. 2(d) is applied to the circuit shown in FIGS. 1(a) and 1(b), there is no need for the NMOS transistor NT18 or the circuit (in FIG. 2(b)) of the address signal processing unit which corresponds to the aforementioned NMOS transistor NT18.

In the same manner, in the enable signal generating unit shown in FIG. 2(c), when the power is turned on the gates of the PMOS transistor PT7 and the NMOS transistor NT5 receive as input power-up signal PUP, which remains at the low level for a fixed period of time and then becomes the high level. This high-level status is maintained until the power is turned off.

During this process, if the fuse FEN has not been blown, the output of the drain of the PMOS transistor PT7 is maintained at the low level. This level of this signal is then inverted by the inverter IN3 to obtain a high-level signal which is inputted to the gate of the PMOS transistor PT8.

Thus, the PMOS transistor PT8 is maintained in the off state, and the output EN of the aforementioned enable signal generating unit is maintained at the low level. This output is then inputted to the other input of the NAND gate (1), shown in FIG. 2(d).

In addition, in the coincidence/un-coincidence signal generating unit in FIG. 2(d), since the other input of the NAND gate (1) receives as input a low-level enable signal EN as described above, the output of the NAND gate (1) remains at the high level at all times. This high-level output is inverted by the inverter IN7 to make it low-level.

Specifically, if no fuse set is selected for repairing a memory cell defect, and the fuses FI, FJ, and FEN are not blown, then low-level coincidence signals CIS will be outputted from those fuse sets.

On the other hand, the un-coincidence signal UCIS, which is the output of the inverter IN12, is outputted at the high level when the address signal is inputted.

In contrast, in cases where a defect occurs in a memory cell in a certain subarray, and the objective is to repair it using the corresponding fuse set, then the fuses FI, FJ, and FEN are blown according to a fuse blowing program.

In FIG. 2(a), when the fuse FI is blown, the drain output of the PMOS transistor PT3 is maintained at the high level by the temporary low-level output of a power-up signal PUP. This high-level signal is inputted to the following: the gate of the NMOS transistor NT1 of the gate circuit GT1, and the gate of the PMOS transistor PT2 of the gate circuit GT2. In addition, the signal level is inverted by the inverter IN1 to obtain a low-level signal, which is the input to the following: the gate of the PMOS transistor PT1 of the gate circuit GT1, the gate of the NMOS transistor NT2 of the gate circuit GT2, and the gate of the PMOS transistor PT4.

As a result, the gate circuit GT1 is turned on, and the gate circuit GT2 is turned off. During this process, since the PMOS transistor PT4 is turned on, the gate circuit GT1 is maintained in the on state. Thus, the address signal AXI passes through the gate circuit GT1 and appears in the output AI. This output is then inputted to the gates of the NMOS transistors NT6–NT17 shown in FIG. 2(d).

Also, in cases where the fuse FJ shown in FIG. 2(b) is blown in addition to the fuse FI being blown, the drain output of the PMOS transistor PT5 is maintained at the high level by the temporary low-level output of a power-up signal PUP. The output XJ passes through the inverter IN2, becomes low, and is inputted to the gates of the NMOS transistors NT18–NT20 shown in FIG. 2(d).

During this process, the fuse FEN shown in FIG. 2(c) is blown together with the aforementioned fuse FI, etc. As a result, the drain output of the PMOS transistor PT7 is maintained at the high level by a temporary low-level output of power-up signal PUP. The enable signal EN is then inputted as a high-level signal to the other input of the NAND gate (1) shown in FIG. 2(d).

Under these conditions, if the drains of the NMOS transistors NT6, NT10, and NT14 are all at the low level, i.e., if the programmed address matches the input address signal, then the output of the 3-input NOR gate becomes high. This high-level signal is inputted to one of the inputs of the NAND gate (1). Since the output EN of the enable signal generating unit shown in FIG. 2(c) is at the high level, a high-level signal is inputted to the other input of the NAND gate (1).

Since high-level signals are inputted to the two inputs of the NAND gate (1), its output will be at the low level. The low-level output of the NAND gate (1) is then inverted by the inverter IN7 to make it high-level.

Specifically, if a fuse set is selected to repair a defect in a memory cell, but the fuses FI, FJ, and FEN are not burned, then a high-level coincidence signal CIS will be outputted from that fuse set.

On the other hand, the un-coincidence signal UCIS, which is the output of the inverter IN12, is switched to the low level.

The row decoder enable signal generating unit (4) comprises the AND gate (4) and obtains the logical product of the uncoincidence signals UCIS outputted from the fuse sets FS0–FS7. Next, it outputs the results, as a row decoder enable signal RDEN, to the subarray selection signal generating unit (8).

Specifically, if there is no defect in the memory cells MCL in the memory array (1), i.e., if none of the fuses in the fuse sets FS0–FS7 have been blown, then a high-level row decoder enable signal RDEN is outputted. If, however, there is a defect in a memory cell MCL, and a fuse in any of the fuse sets FS0–FS7 has been blown to repair the defect, then a low-level row decoder enable signal RDEN is outputted.

The redundancy enable signal generating unit (5) comprises a NOR gate (5), and obtains the negative logical sum of the coincidence signals CIS outputted from the fuse sets FS0–FS7. Next, it outputs the results, as a redundancy enable signal RREN_, to the address middle signal generating unit (6), and to the spare driver set SDRS in the subarrays SUB0–SUB7.

Specifically, if there are no defects in the memory cells MCL in the memory array (1), i.e., if none of the fuses in the fuse sets FS0–FS7 have been blown, then a high-level inactive redundancy enable signal RREN_ is outputted. If, however, there is a defect in a memory cell MCL, and a fuse in any of the fuse sets FS0–FS7 has been blown to repair the defect, then a low-level active redundancy enable signal RREN_ is output.

The address middle signal generating unit (6) is formed by connecting eight AND gates AND6 in parallel. It obtains the logical product of the redundancy enable signal RREN_ outputted from the redundancy enable signal generating unit (5), and any output from the address input unit (2). Next, it outputs the results, as an address middle signal RFM, to the address middle signal decoders (12) of the row decoders RWD0–RWD7 corresponding to the subarrays SUB0–SUB7. The number of the aforementioned AND gates comprising AND6 varies depending on the pre-decoding method.

The address low signal generating unit (7) is formed by connecting four AND gates AND7 in parallel. It obtains the logical product of several outputs from the address input unit (2), then outputs the results, as an address low signal RFL, to the address low signal decoder (13) of each row decoder RWD0–RWD7 corresponding to the subarrays SUB0–SUB7.

The subarray selection signal generating unit (8) comprises the following: eight AND gates AND8, in parallel; and eight OR gates OR8, also in parallel to correspond in a one-to-one manner with the fuse sets FS0–FS7.

The AND gates AND8 obtain the logical product of the row decoder enable signal RDEN outputted from the row decoder enable signal generating unit (4) and any output from the address input unit (2).

The OR gates OR8 obtain the logical sum of the outputs of the AND gates AND8 and the coincidence signals CIS outputted from the fuse sets FS0–FS7. The logical result is outputted, as a subarray selection signal SS, to the address low signal decoder (13) of each of the row decoders RWD0–RWD7 corresponding to the subarrays SUB0–SUB7.

The operations related to the above structures will now be described.

When none of the fuses in the fuse sets FS0–FS7 have been blown, the fuse sets FS0–FS7 output low-level coincidence signals CIS and high-level un-coincidence signals UCIS. The redundancy enable signal RREN_ and the row decoder enable signal RDEN are at the high level.

Under this condition, when an address signal is inputted to the address input unit (2), that address signal, and the signal obtained by inverting it, are outputted to the following: the fuse sets FS0–FS7, the address middle signal generating unit (6), the address low signal generating unit (7), and the subarray selection signal generating unit (8).

Since the redundancy enable signal RREN_ is outputted at the high level, AND gates AND6 and AND7 corresponding to the addresses specified in the address middle signal generating unit (6) and the address low signal generating unit (7) output, to the subarrays SUB0–SUB7, a high-level address middle signal RFM and address low signal RFL.

In addition, since the row decoder enable signal RDEN is outputted at the high level, one AND gate AND8 from the AND gates AND8 of the subarray selection signal generating unit (8) and corresponding to the specified address, outputs a high-level signal. As a result, a single OR gate OR8, likewise corresponding to the specified address, outputs a single subarray selection signal SS to, for example, the address low signal decoder (13) of the subarray SUB0.

In the address middle signal decoder (12) of each of the subarrays SUB0–SUB7, when a single high-level address middle signal RFM is inputted, a single NAND gate corresponding to the specified address outputs a active signal at the low level to the word set to which its output is connected.

However, the drivers DRV contained in that word set do not enter the drive state unless a signal active at the high level is inputted from the address low signal decoder (13). In addition, since the spare word set SWLS of the subarrays SUB0–SUB7 receives as input a redundancy enable signal RREN_ which is inactive and at the high level, the status will not shift to drive status, even if a signal active at the high level is inputted from the address low signal decoder (13).

The aforementioned signal active at the high level is outputted only from one AND gate in the address low signal decoder (13) of the subarray (subarray SUB0 in the present example) for which an address has been specified and to which a subarray selection signal SS has been inputted.

Thus, of the four drivers DRV in the single word set in the specified subarray SUB0, only one driver DRV is set in the drive status. The single word line with the specified address is then enabled, allowing the operations of data read or write to be performed.

Under these conditions, if a defect has occurred in one memory cell MCL in, for example, the subarray SUB0, and the objective is to repair it, then a fuse in the specified fuse set FS0 is blown.

As a result, the fuse set FS0 outputs a un-coincidence signal UCIS at the low level, and outputs a coincidence signal CIS at the high level.

When the low-level un-coincidence signal UCIS is outputted from the fuse set FS0, the row decoder enable signal generating unit (4) outputs a low-level row decoder enable signal RDEN. Thus, no high-level signal will be outputted from any of the AND gates AND8 of the subarray selection signal generating unit (8).

On the other hand, when the fuse set FS0 outputs the high-level coincidence signal. CIS, the redundancy enable signal generating unit (5) outputs the redundancy enable signal RREN_ (active at the low level) to the spare word set SWLS of each subarray SUB0–SUB7. In addition, it is outputted to the address middle signal generating unit (6).

When the low-level redundancy enable signal RREN_ is inputted, no high-level address middle signals RFM are outputted from any of the AND gates AND6 of the address middle signal generating unit (6). Thus, since the address middle signal decoder (12) of each of the subarrays SUB0–SUB7 only receives the low-level address middle signal RFM as input, the output of all of the decoders (12) is inactive and high-level. In addition, there is no shift to the drive status in the word sets WLS0–WLSn, even if a active signal at the high level is inputted from the address low signal decoder (13).

In contrast, since the input to the AND gates AND7 of the address low signal generating unit (7) consists only of the output signal of the address input unit (2), the AND gate AND7 corresponding to the specified address outputs a high-level address low signal RFL to the address low signal decoder (13) of each subarray SUB0–SUB7.

In addition, since the fuse set FS0 outputs a coincidence signal CIS at the high level, only a single OR gate OR8, corresponding to the subarray selection signal generating unit (8), outputs a single subarray selection signal SS to the address low signal decoder (13) of the subarray with the specified address, such as the subarray SUB0.

Thus, the high-level active signal is outputted only from a single AND gate AND11 in the address low signal decoder (13) of the subarray (the subarray SUB0 in the present example) which has been address-specified and into which the subarray selection signal SS has been inputted. Thus, of the four spare drivers SDRV in the single spare word set SWLS in the specified subarray SUB0, only one spare driver SDRV is set in the drive status. The single spare word line is then enabled, allowing the memory cells MCL to be replaced at the level of single word line units.

The above explanation pertains to the operations taking place when a defect occurs in a memory cell MCL in the subarray SUB0, and the fuse set FS0 is selected to repair it using the spare word set SWLS of the same subarray SUB0. It should be noted, however, that it is also possible to repair a defect using a single spare word set SWLS in a different memory array SUB1–SUB7 without using the spare word set SWLS contained in the subarray SUB0 which is the same as the subarray SUB0 in which the defect occurred.

In such cases, a fuse set corresponding to one of the subarrays SUB1–SUB7 containing the spare word set SWLS to be used, such as the fuse set FS5, which corresponds in a one-to-one manner with the subarray SUB5, is selected, and a corresponding fuse is blown.

As a result, a high-level coincidence signal CIS is outputted from the selected fuse set FS5, and the OR gate OR8 which corresponds to the fuse set FS5 of the subarray selection signal generating unit (8) outputs a high-level subarray selection signal SS to the address low signal decoder (13) of the corresponding subarray SUB5. The aforementioned decoder (13) then outputs a active signal at the high level to each spare driver SDRV in the corresponding spare word set SWLS.

During this process, since the redundancy enable signal RREN_ is at the low level, of the four spare drivers SDRV in the spare word set SWLS in the subarray SUB5, only one spare driver SDRV is set in the drive status. The single spare word line is then enabled, allowing the word line containing the defect in the subarray SUB0 to be replaced by the spare word line contained in the subarray SUB5.

In addition, it is also possible to repair defects in four word lines using a single spare word set by allowing the fuse sets FS0–FS3 to correspond to the four spare word lines of the spare word set SWLS of the subarray SUB0.

An example of a program for blowing the fuses in the fuse sets will now be discussed. When a defect occurs in the word line having the address A11–A0=(0,0,0,0,0,0,0,0,0,0,0,1), two fuses are blown: the fuse at I=0 in the address signal processing unit shown in FIG. 2(a), and the fuse FEN of the enable signal generating unit shown in FIG. 2(c).

As described above, with the aforementioned first embodiment, when a defect occurs in a certain subarray, it is possible to repair it using the spare word lines WSA–WSD of the spare word set SWLS contained in that subarray, in addition to which, it can be repaired using the spare word set SWLS of a different subarray. For these reasons, the present invention is advantageous over conventional redundant circuitry in that it enables an improvement in the efficiency of the repairing operation, and an improvement in yield during manufacturing.

In the aforementioned first embodiment, one spare word set and one fuse set are provided for each subarray. It should be noted, however, that it is also possible to install the spare word sets and fuse sets to correspond, for example, to only six of every eight subarrays. In such cases, the fuse sets can be used to switch the addresses of all of the word lines in the memory array (1).

Figure 3A:
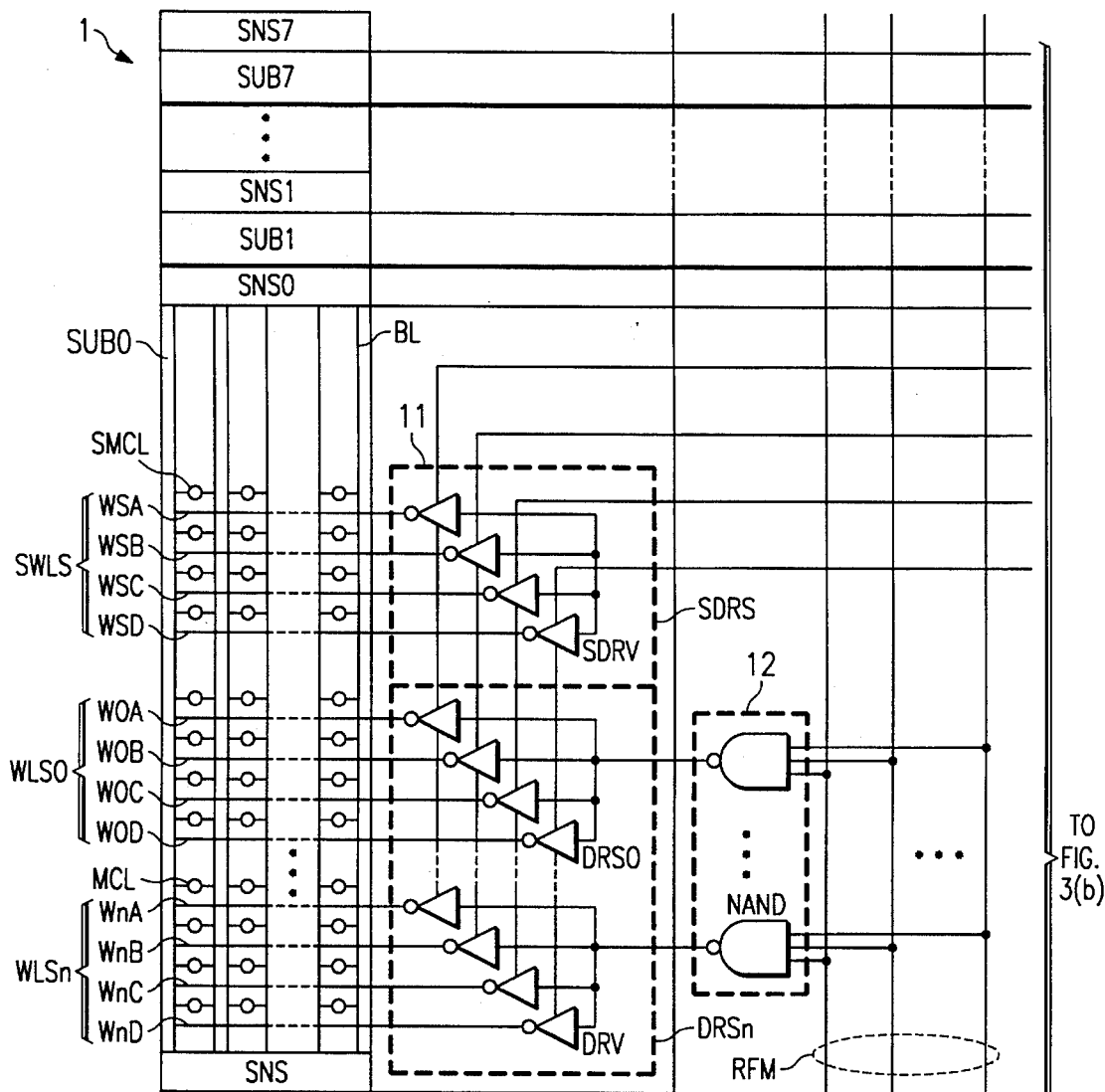
FIGS. 3 (a) and 3 (b) are portions of a schematic diagram which shows the second embodiment of the semiconductor memory device of the present invention.
Figure 3A:
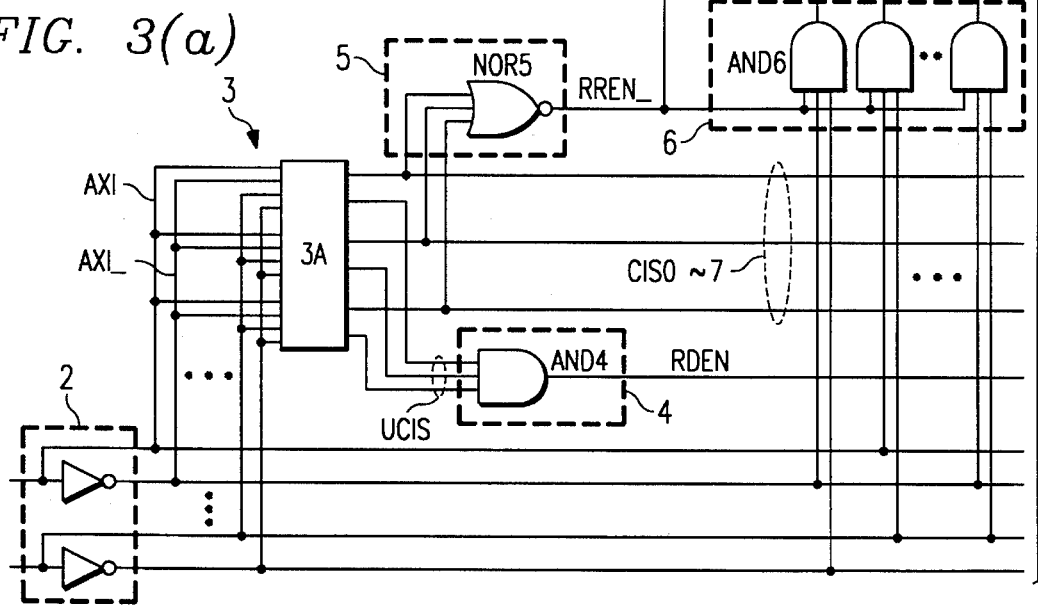
Figure 3B:
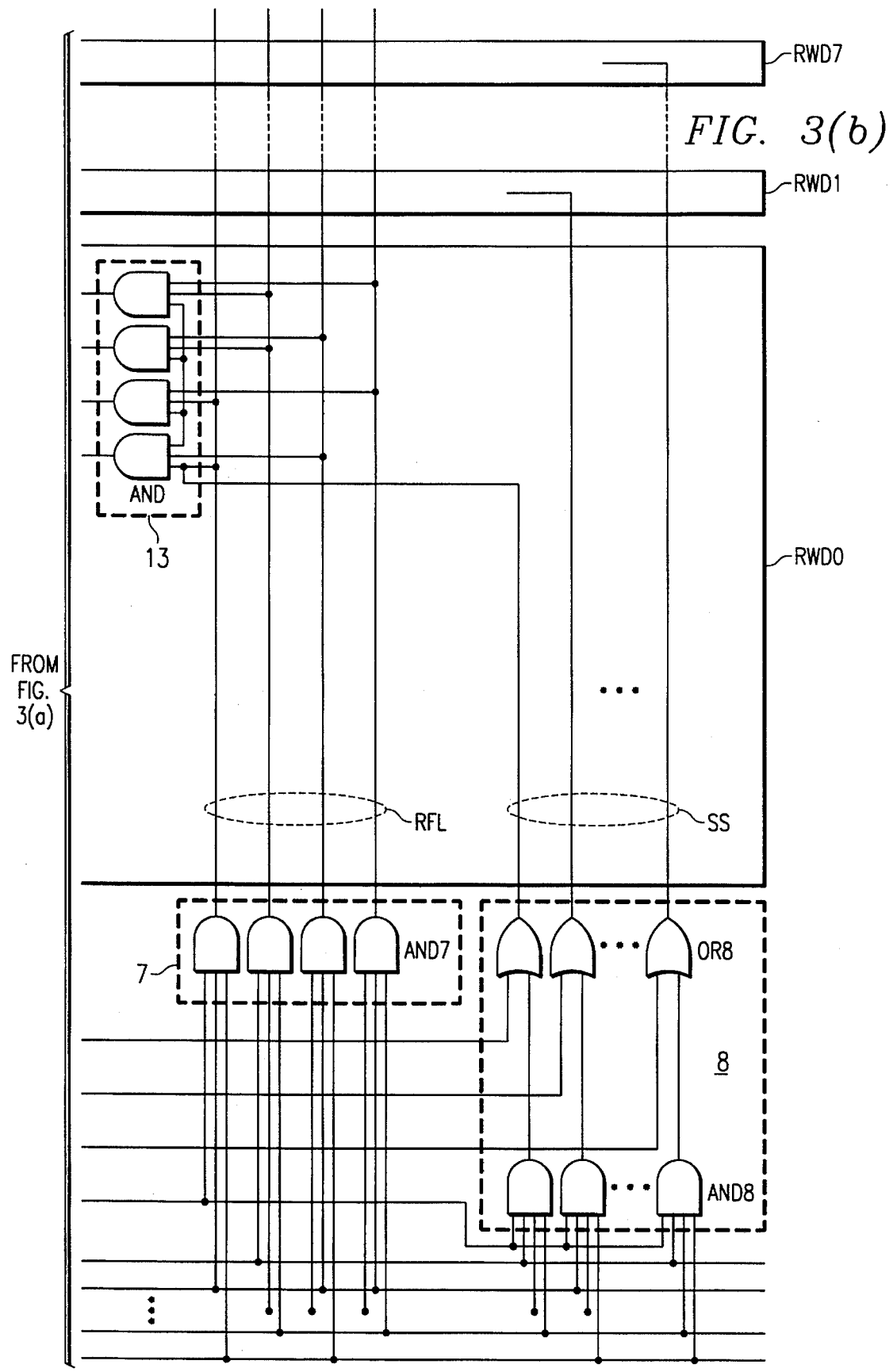

FIGS. 3(a) and 3(b) are portions of a schematic diagram which shows a second embodiment of the redundant selection circuit pertaining to the present invention. The present embodiment differs from the aforementioned first embodiment in the following manner.

Specifically, in the first embodiment, eight fuse sets FS0–FS7 are installed with respect to the spare word sets of eight subarrays SUB0–SUB7 to correspond in a one-to-one manner. Thus, when a defect occurs in a certain subarray, it can be repaired using the spare word lines WSA–WSD of the spare word set SWLS contained in that subarray, or using the spare word set SWLS of a different subarray. As a result, the repairing operation is more efficient than with conventional designs.

In contrast, with the present embodiment, the fuse set array is designed such that it is possible to use any fuse set to select the subarray serving as the output destination of the coincidence signal. As a result, multiple correspondences are formed between the fuse sets and the redundancy subarrays, thereby improving the efficiency of the repairing operation.

FIGS. 3(a) and 3(b), which show the circuit structure of the present embodiment, and FIGS. 1(a) and 1(b), which show the circuit structure of the first embodiment, differ from each other only with respect to the fuse set arrays (3A) and (3). In other respects, the structures are the same in the figures. For this reason, the structure of the fuse set array (3A) shown in FIG. 3(a) will be described with reference to the schematic diagram shown in FIG. 4.

The fuse set array (3A) of the present embodiment comprises the following: a number n of fuse sets FS0–FSn; a number n of coincidence signal line selection circuits LSL0–LSLn; eight signal lines SGL0–SGL7, which are connected to OR gates OR8, which correspond to the individual subarrays of the subarray selection signal generating unit (2) shown in FIG. 3(b); PMOS transistors PTL0–PTL7, which are connected to one end of the eight signal lines SGL0–SGL7; and driver circuits DR0–DR7, which are situated on the other ends of the signal lines SGL0–SGL7, i.e., at the locations of connection to the coincidence signal output lines.

Each of the fuse sets FS0–FSn is connected in parallel to the output of the address input unit (2), and each has circuit structures equivalent to the circuit structures shown in FIGS. 2(a), 2(b), and 2(c). In addition, their operations are also equivalent. For these reasons, their structures and operations will not be explained here.

The number n, referring to the number of fuse sets, is set to be greater than or equal to the number of coincidence signals CIS, i.e., greater than or equal to 8. Specifically, it is set as suitable to a value in the range of 8 to 32, according to the proportion of defects in single word line (including bit defects) and defects in two or more neighboring lines. For example, if 100% of the cases involve two or more lines defects, then the value is set to 8; if 100% of the cases are single line defects, then the value is set to 32. The reason for this is that a single spare word set consists of four spare word lines.

The coincidence signal line selection circuits LSL0–LSLn are connected to the coincidence signal CIS output units of the fuse sets FS0–FSn. In addition, each comprises eight NMOS transistors N0–N7 and eight fuses $f_0$–$f_7$.

The sources of the NMOS transistors N0–N7 of the coincidence signal line selection circuits LSL0–LSLn are grounded. Their drains are connected to one end of the fuses $f_0$–$f_7$. Their gates are connected to the coincidence signal CIS output lines of the fuse sets FS0–FSn.

In addition, the other ends of the fuses $f_0$–$f_7$ are connected to the signal lines SGL0–SGL7. More specifically, the other end of the fuse $f_0$ is connected to the signal line SGL0; the other end of the fuse $f_1$ is connected to the signal line SGL1; the other end of the fuse $f_2$ is connected to the signal line SGL2; the other end of the fuse $f_3$ is connected to the signal line SGL3; the other end of the fuse $f_4$ is connected to the signal line SGL4; the other end of the fuse $f_5$ is connected to the signal line SGL5; the other end of the fuse $f_6$ is connected to the signal line SGL6; and the other end of the fuse $f_7$ is connected to the signal line SGL7.

The aforementioned fuses $f_0$–$f_7$ are blown by a laser. In the present case, they are blown so as to leave remaining the fuse connected to the line SGL0–SGL7 requiring the output of the coincidence signal CIS of the fuse set.

As described above, the single lines SGL0–SGL7 are connected to the other ends of the fuses $f_0$–$f_7$ of the coincidence signal line selection circuits LSL0–LSL7. On one end, they are connected to the drains of the PMOS transistors PTL0–PTL7, and on the other end, they are connected to the driver circuits DR0–DR7.

The sources of the PMOS transistors PTL0–PTL7 are connected to the source voltage $V_{DD}$, and their gates are connected to the signal line used for the RAS clock signal PLX. Thus, when the RAS clock signal RLX is inputted to the gates at the low level, the PMOS transistors PTL0–PTL7 are turned on. The levels of the signal lines SGL0–SGL7 are maintained at the level of the source voltage $V_{DD}$ if there is no defect to repair.

The driver circuits DR0–DR7 comprise the PMOS transistors P0–P7 and the inverters I0–I7. The levels of the coincidence signals CIS on the signal lines SGL0–SGL7 are inverted and then output to the subarray selection signal generating unit (8) and the redundancy enable signal generating unit (5) shown in FIGS. 3(a) and 3(b).

Figure 4:
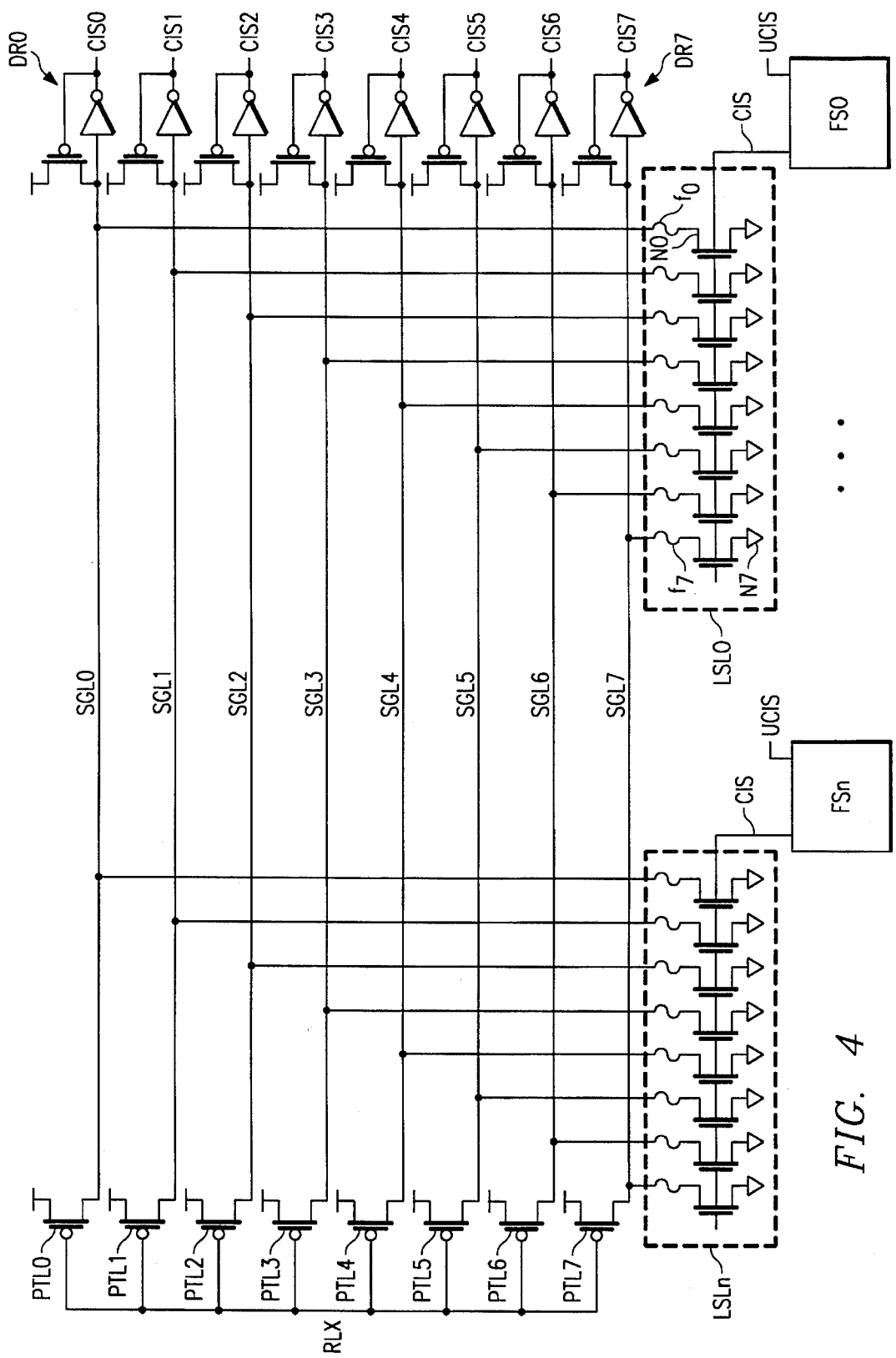
FIG. 4 is a schematic diagram which shows a specific example of the fuse set array in FIG. 3(a).

It should be noted that in order to simplify the presentation, FIG. 4 only shows the numbers referring to the driver circuits DR0 and DR7.

In addition, the row decoder enable signal generating unit (4) shown in FIG. 3(a) receives as input the un-coincidence signals UCIS of the number n of fuse sets FS0–FSn. Thus, the AND gate AND4 outputs the logical product of a number n of un-coincidence signals UCIS. In this respect as well, the present case is different from the first embodiment.

The operations involving the above structures will now be explained.

The description given below pertains to a case in which the fuse set FS0 is selected, and the spare word set SWLS of the subarray SUB5 is used in order to repair a defect in a memory cell MCL contained in a certain subarray.

First, the gates of the PMOS transistors PTL0–PTL7, which are connected to one end of the signal lines SGL0–SGL7, receive as input a low-level RAS clock signal RLX. As a result, the PMOS transistors PTL0–PTL7 are turned on, and the signal lines SGL0–SGL7 are maintained at the level of the source voltage $V_{DD}$, i.e., at the high level. In this case, the fuses FI, FJ, and FEN of the fuse set FS0 are blown according to the address of the memory cell with the defect in advance.

Under these conditions, if, for example, a coincidence exists between the fuse program of the fuse set FS0 and the input address, then the fuse set FS0 outputs a coincidence signal CIS at the high level to the coincidence signal line selection circuit LSL0. During this process, since the fuse set FS0 outputs a low-level uncoincidence signal UCIS to the row decoder enable signal generating unit (4), the row decoder enable signal RDEN is set to the low level, and no high-level signal is outputted from any of the AND gates AND8 of the subarray selection signal generating unit (8).

In addition, the processes of blowing the fuses $f_0$–$f_4$, $f_6$, and $f_7$ (the fuse $f_5$ is excluded), of the group of fuses $f_0$–$f_7$ in the coincidence signal line selection circuit LSL0, are also carried out in advance, parallel with the process of blowing the fuses in the fuse set FS0.

After being outputted at high level from the fuse set FS0, the coincidence signal CIS is inputted to the gates of the NMOS transistors N0–N7 in the coincidence signal selection circuit LSL0, thereby turning on the NMOS transistors N0–N7.

During this process, since only the fuse $f_5$ has not been blown, the signal line SGL5 is connected to a ground through the fuse $f_5$ and the NMOS transistor N5. As a result, the signal line SGL5 level is low.

In contrast, even through the other NMOS transistors N0–N4, N6, and N7 are turned on, since the fuses $f_0$–$f_4$, $f_6$, and $f_7$ connected to their drains are blown, the signal lines SGL0–SGL4, SGL6, and SGL7 are not connected to a ground. Thus, the signal lines SGL0SGL4, SGL6, and SGL7 remain at the high level.

As a result, a high-level coincidence signal CIS5 is outputted from the driver circuit DR5, while low-level coincidence signals CIS0–CIS4, CIS6, and CIS7 are outputted from the driver circuits DR0–DR4, DR6, and DR7.

The subarray selection signal generating unit (8) receives as input the high level coincidence signal CIS5 from the fuse set array (3A), then outputs, to the address low signal decoder (13) of the corresponding subarray SUB5, a high-level subarray selection signal SS, through the OR gate OR8 connected to the output line for the coincidence signal CIS5.

In addition, an active signal at the high level is outputted from that decoder (13) to the spare drivers SDRV of the corresponding spare word set SWLS.

During this process, since the redundancy enable signal RREN_ becomes low, of the four drivers SDRV in the spare word set SWLS in the subarray SUB5, only one driver SDRV is set in the drive status. The single spare word line is then activated, allowing the word line containing the defect in the subarray SUB0 to be replaced by the spare word line contained in the subarray SUB5.

As described above, with the aforementioned second embodiment, the fuse set array (3A) is designed such that it is possible to use any fuse set FS0–FSn to select the subarray serving SUB0–SUB7 as the output destination of the coincidence signal CIS0–CIS7. As a result, multiple correspondences are formed between the fuse sets FS0–FSn and the subarrays SUB0–SUB7 using redundancy (spare word lines) thereby improving the efficiency of the repairing operation even more than in the aforementioned first embodiment.

With the aforementioned second embodiment, spare word sets are installed for each subarray. However, it is also possible to install spare word sets only for a certain single subarray, or to install spare word sets in six out of eight subarrays.

From a different perspective, with the first embodiment, the eight subarrays SUB0–SUB7 are provided with spare word sets SWLS in each of which four spare word lines WSA–WSD are grouped. Thus, since the eight fuse sets FS0–FS7 correspond in a one-to-one manner with the spare word sets SWLS containing the corresponding groups, eight fuse sets are provided for the eight subarrays SUB0–SUB7. However, there is a total of 32 spare word lines. Thus, yield is determined according to the number of fuse sets.

In this respect, if the conditions for the spare word lines remain the same, but the number of fuse sets is increased, then in the structure of the first embodiment, two or more fuse sets will correspond to each spare word set SWLS, which contains four word lines WSA–WSD forming a single group.

However, as shown in FIGS. 2(a)–2(d), if there is a function for simultaneously repairing two or more neighboring word lines when the fuse FJ in a fuse set is blown, then the spare word lines contained in the used spare word set (one group consisting of four lines) will be used up. As a result, the fuse set corresponding to this spare word set of four lines forming one group will be wasted.

In contrast, in the second embodiment, since multiple correspondences (any-to-any correspondence) are formed between the fuse sets FS0–FSn and the subarrays SUB0–SUB7 utilizing redundancy, the problem of wasted fuse sets described above does not exist.

In the aforementioned second embodiment and the aforementioned first embodiment, eights spare word sets, forming single groups of four spare word lines, are provided for the eight subarrays. It should be noted, however, that in actual designs, the number of spare word sets should be determined as follows, according to the defect density.

Specifically, with A corresponding to the area of the eight subarrays, D corresponding to defect density, and $n_F$ corresponding to the number of fuse sets for the eight subarrays, the yield $P_{F(n)}$ determined according to the number of fuse sets, is expressed in the following formula.

$$P_{F(n)} = \sum_{n=0}^{n_F} (AD)^n e^{-(AD)}/n!$$

Next, when the spare word set is structured using four spare word lines as shown in FIGS. 1(a) and 1(b) and in FIGS. 3(a) and 3(b), the area which can be repaired by one of the four spare word lines, i.e., the area of the least significant corresponding bit (1 bit out of four), is A/4. If the number of spare word sets in the eight subarrays is $n_W$, then the yield $P_{W(n)}$ determined according to the number of spare word sets, is expressed in the following formula.

$$P_{W(n)} = \sum_{n=0}^{n_W} ((A/4)D)^n e^{-(AD)}/n! \quad \text{(Formula 9)}$$

In this manner, the number of fuse sets $n_F$ is determined according to the defect density D. In addition, the number $n_W$ of spare word sets is set such that the yield $P_{W(nW)}$ determined according to the number of spare word sets is approximately equal to the yield $P_{F(nF)}$ determined according to the number of fuse sets. In addition, a number of spare word sets are added to correspond to the percentage of defects involving two or more lines. Under these conditions, it is not required that the number of spare word sets be a multiple of eight.

In addition, with the present embodiments, the discussion involves cases where the number of subarrays is eight. However, this is obviously not a restriction.

Figure 5:
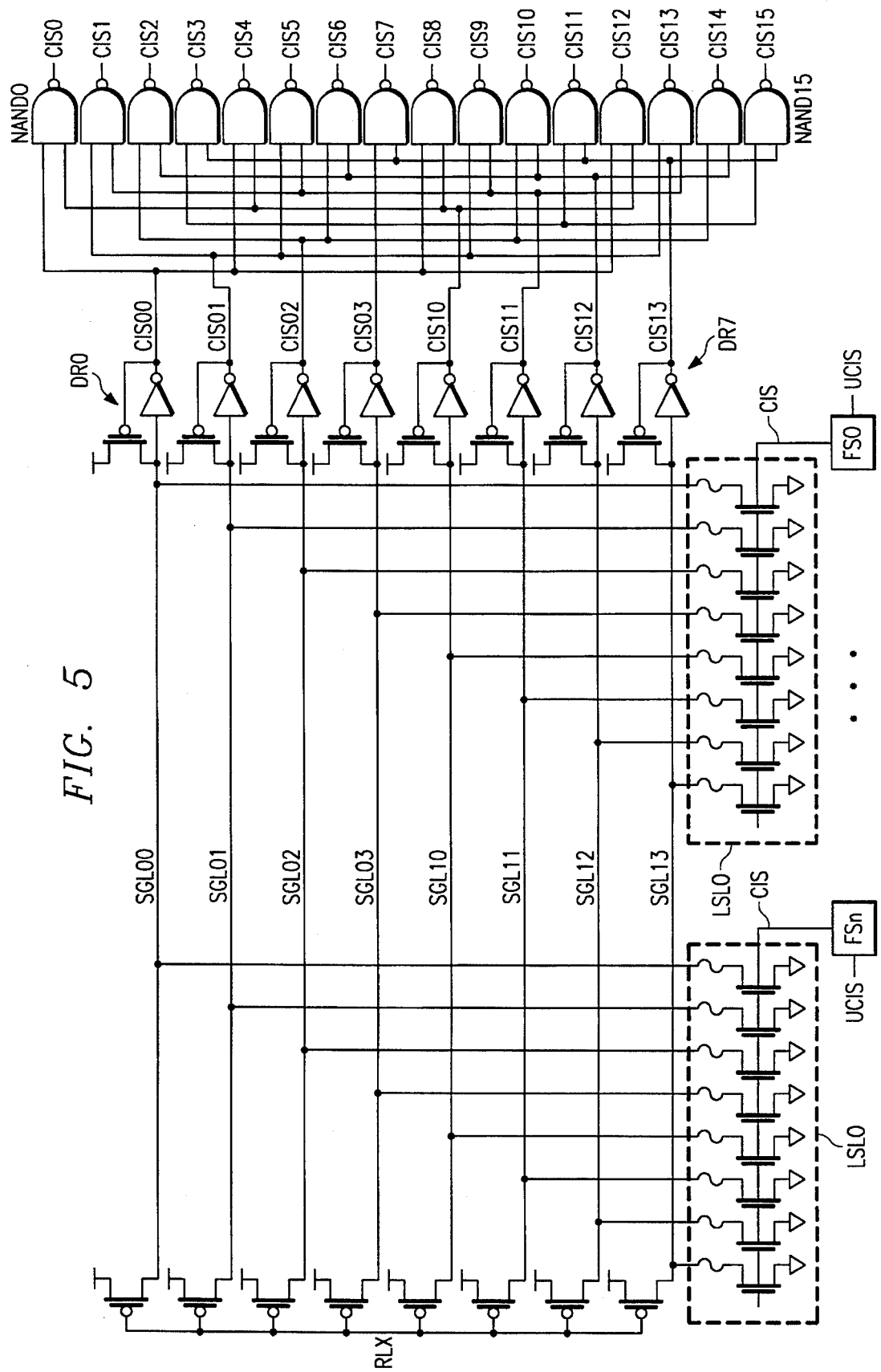
FIG. 5 is a schematic diagram which shows an example of the structure of a fuse set array for a case in which the number of subarrays is 16.

FIG. 5 is a schematic diagram which shows an example of the structure of a fuse set array for a case in which the number of subarrays is 16.

The structure shown in FIG. 5 is nearly the same as the structure shown in FIG. 4 which is a structure involving eight subarrays. However, in the present case, 16 NAND gates NAND0–NAND15 are connected to the output sides of the driver circuits DR0–DR7. The signal lines are thus split into two groups. More specifically, the signal lines SGL0–SGL3 shown in FIG. 4 form a single group of signal lines SGL00–SGL03; the signal lines SGL4–SGL7 shown in FIG. 4 form another group of signal lines SGL10–SGL13; the outputs of the driver circuits DR0 and DR4 are connected to the inputs of the NAND gates NAND0, NAND4, NAND8, and NAND12; the outputs of the driver circuits DR1 and DR5 are connected to the inputs of the NAND gates NAND1, NAND5, NAND9, and NAND13; the outputs of the driver circuits DR2 and DR6 are connected to the inputs of the NAND gates NAND2, NAND6, NAND10, and NAND14; and the outputs of the driver circuits DR3 and DR7 are connected to the inputs of the NAND gates NAND3, NAND7, NAND11, and NAND15. Thus, the structure is designed such that coincidence signals CIS00–CIS15 are outputted from the NAND gates NAND0–NAND15.

When a repairing operation is performed using a structure such as this one, of the fuses $f_0$–$f_7$ in the coincidence signal line selection circuits LSL0–LSLn, the three fuses from the group of fuses $f_0$–$f_3$, and three fuses from the group of fuses $f_4$–$f_7$ (giving a total of six fuses) are blown. The subarrays are then assigned to different fuse sets.

Figure 6:
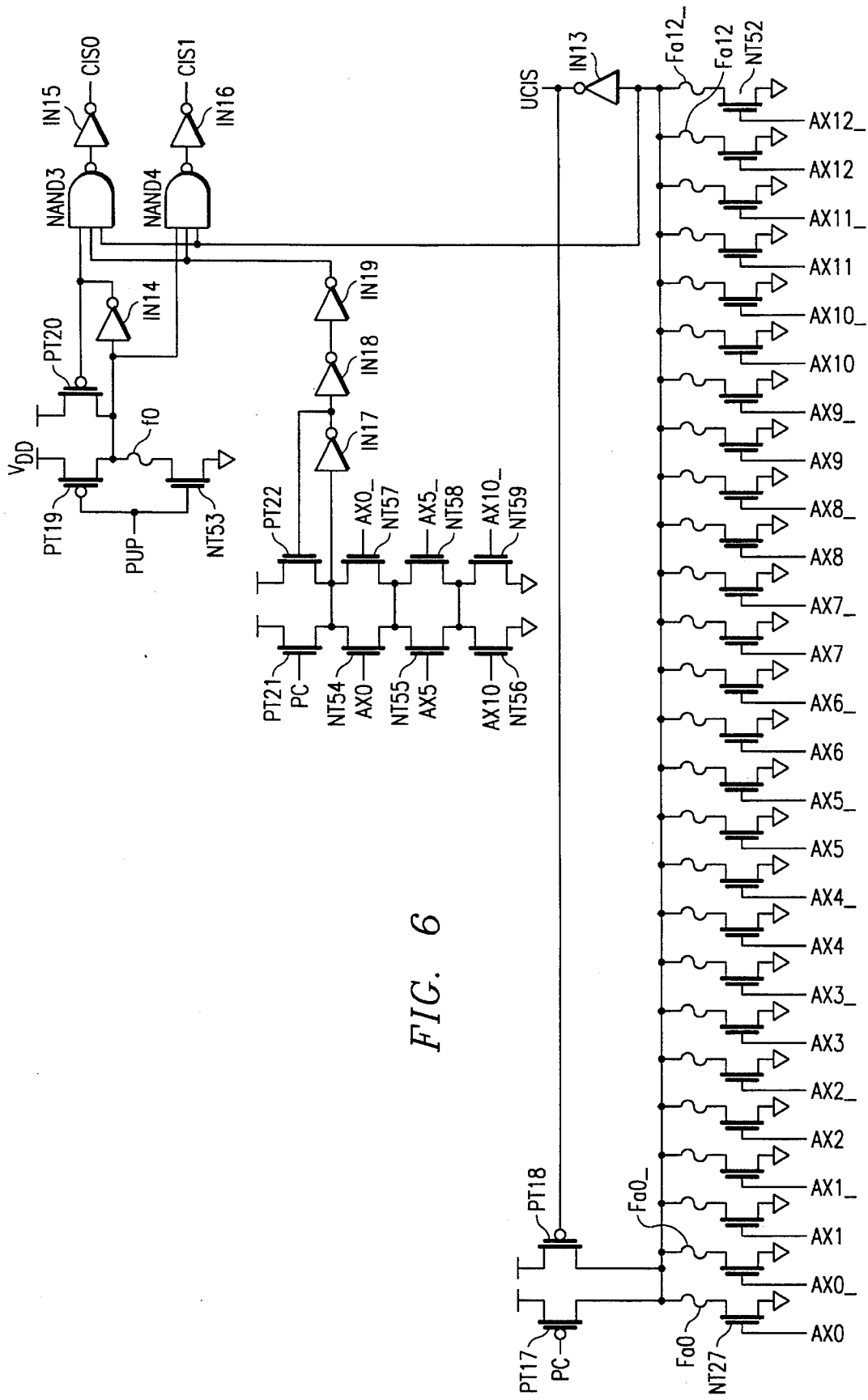
FIG. 6 is a schematic diagram which shows another example of a fuse set structure.

In addition, FIG. 6 is a schematic diagram which shows another example of a fuse set structure. In this case, a single fuse set is allowed to be switched between two coincidence signals CIS0 and CIS1. Under normal circumstances, when the fuse $f_0$ has not been blown, the coincidence signal CIS0 is selected. If the fuse $f_0$ is blown, then the coincidence signal CIS1 is selected.

The fuse set shown in FIG. 6 comprises the following: PMOS transistors PT17–PT22, NMOS transistors NT27–NT59, inverters IN13–IN19, 3-input NAND gates NAND3 and NAND4, the fuse $f_0$, and the fuses $f_{a0}$, $f_{a0\_}$ . . . , $f_{a12}$, $f_{a12\_}$. In FIG. 6, in order to simplify the illustration, some of the numbers are omitted for the fuses $f_{a0}$, $f_{a0\_}$ · · · , $f_{a12}$, $f_{a12\_}$, and the NMOS transistors NT27–NT52.

It should be noted that the sources of the PMOS transistors PT17–PT22 are connected to the source voltage $V_{DD}$, and the sources of the NMOS transistors NT27–NT53, NT56, and NT 59 are grounded.

The drain of the PMOS transistor PT17 is connected to the following: one end of the fuses $f_{a0}$, $f_{a0\_}$ . . . , $f_{a12}$, $f_{a12\_}$; the drain of the PMOS transistor PT18; the input of the inverter IN13; and one of the inputs of the 3-input NAND gates NAND3 and NAND4. Its gate receives a precharge signal PC as input.

The other ends of the fuses $f_{a0}$, $f_{a0\_}$ · · · , $f_{a12}$, $f_{a12\_}$ are connected with the drains of the NMOS transistors NT27–NT52 respectively.

The gates of the NMOS transistors NT27–NT52 receive as input the address signals AX0, AX0_ . . . , AX12, AS12_, which are outputted from the address input unit (2) shown in FIGS. 1(a) and 3(a).

Thus, in cases where repair is not performed, and the fuses $f_{a0}$, $f_{a0\_}$ · · · , $f_{a12}$, $f_{a12\_}$ are not blown, the level of the drain of the PMOS transistor PT17 is temporarily maintained at the level of the source voltage $V_{DD}$ by the low-level output of the precharge signal PC. However, when the NMOS transistors NT27—NT52 are turned on, it is maintained at ground level, i.e., the low level.

As a result, the output of the inverter IN13 becomes the high level, and in cases where the repairing operation is not performed, the un-coincidence signal UCIS is outputted at the high level.

The gate of the PMOS transistor PT18 is connected to the output of the inverter IN13. When this gate receives a low-level signal as input, the input level of the inverter IN13 is maintained at the high level.

In addition, the drain of the PMOS transistor PT19 and the drain of the NMOS transistor NT53 are connected through the fuse $f_0$. The gates of the PMOS transistor PT19 and the NMOS transistor NT53 are connected to the signal line used for the power-up signal PUP.

Thus, when the aforementioned logic change in the power-up signal PUP occurs, if the fuse $f_0$ is not blown, then the drain of the PMOS transistor PT19 is maintained at the low level. When the fuse $f_0$ is blown, it switches to the high level.

The drain of the PMOS transistor PT19 is connected to the following: the drain of the PMOS transistor PT20, the input of the inverter IN14, and the other inputs of the 3-input NAND gate NAND4.

The output of the inverter IN14 is connected to the following: the gate of the PMOS transistor PT20, and another input of the 3-input NAND gate NAND3.

In addition, the output of the 3-input NAND gate NAND3 is connected to the input of the inverter IN15, and a high-level or low-level coincidence signal CIS0 is outputted from the inverter IN15.

In the same manner, the output of the 3-input NAND gate NAND4 is connected to the input of the inverter IN16, and a high-level or low-level coincidence signal CIS1 is outputted from the inverter IN16.

In addition, the drain of the PMOS transistor PT21 is connected to the following: the drains of the NMOS transistors NT54 and NT57, the input of the inverter IN17, and the drain of the PMOS transistor PT22. Its gate receives the precharge signal PC as input.

In addition, the sources of the NMOS transistors NT54 and NT57 are connected to the drains of the NMOS transistors NT55 and NT58; the sources of the NMOS transistors NT55 and NT58 are connected to the drains of the NMOS transistors NT56 and NT59; and the sources of the NMOS transistors NT56 and NT59 are grounded.

The gates of the NMOS transistors NT54–NT59 receive as input AX0, AX0_, AX5, AX5_, AX10, AX10_, which are the output signals of the address input unit (2), respectively. The NMOS transistors NT54–NT59 are installed in order to obtain the output timing of the coincidence signals CIS0 and CIS1.

The output of the inverter IN17 is connected to the gate of the PMOS transistor PT22, and is also connected, via the inverters IN18 and IN19, to the remaining inputs of the 3-input NAND gates NAND3 and NAND4.

When the fuse sets are designed in the above manner, during the process of repairing a word line with a defect, if the fuse $f_0$ has not been blown, then a low-level uncoincidence signal UCIS, a high-level coincidence signal CIS0, and a low-level coincidence signal CIS1 are outputted. If the fuse $f_0$ has been blown, then a low-level uncoincidence signal UCIS, a low-level coincidence signal CIS0, and a high-level coincidence signal CIS1 are outputted.

The aforementioned first and second embodiments are both very effective within a similar range of application. Applications outside of this range will now be discussed.

In general, with DRAMs (DYNAMIC RANDOM ACCESS MEMORY), the maximum application range of the first embodiment is determined by the refresh cycle (more than two word lines cannot be used within the range of application).

With a 64 MB (Mega Bits) DRAM, for example, the maximum application range is 8 MB, assuming a word line length of 2K and a refresh cycle of 4K.

In cases where a number n of fuse sets is required for the entire 64 MB because of defect density, in order to obtain the same yield, it is necessary that the 8 MB maximum application range contain a number m of spare word lines, i.e., m/4 spare word sets.

Figure 7A:
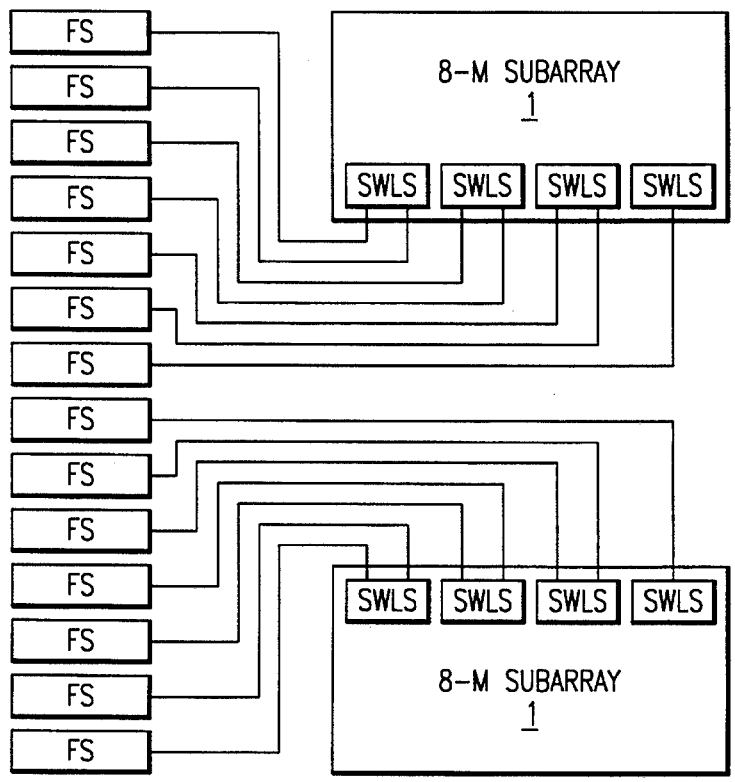
FIGS. 7(a) and 7(b) are explanatory diagrams of the first application of the present invention.
Figure 7B:
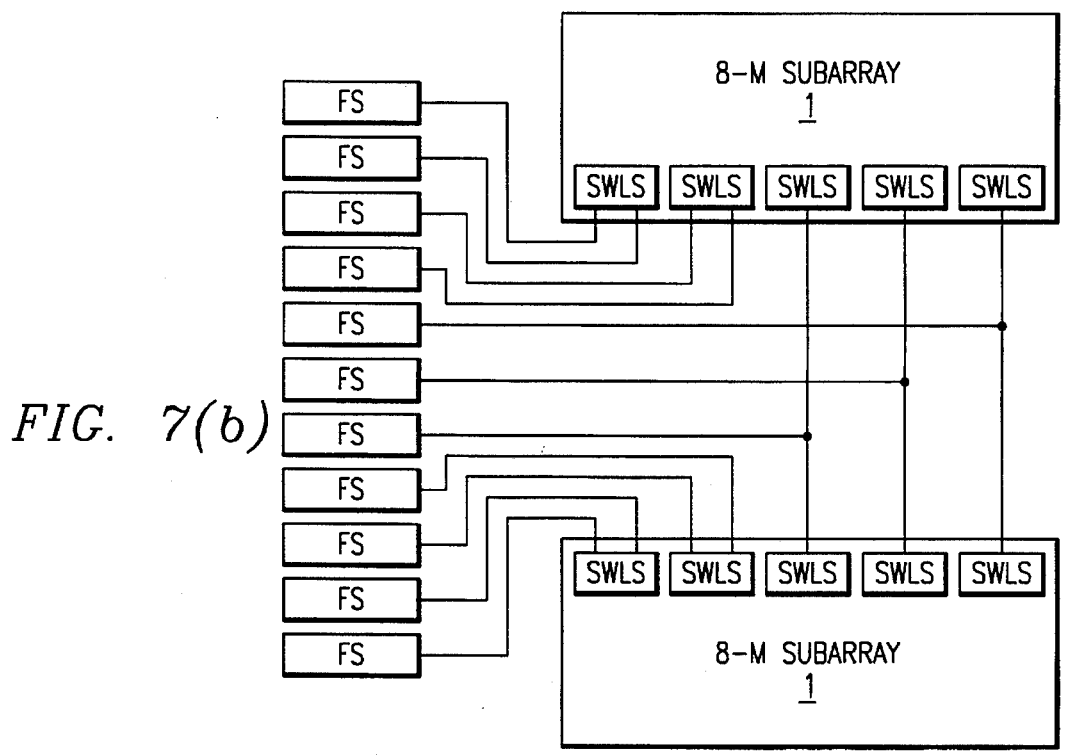
Figure 10:
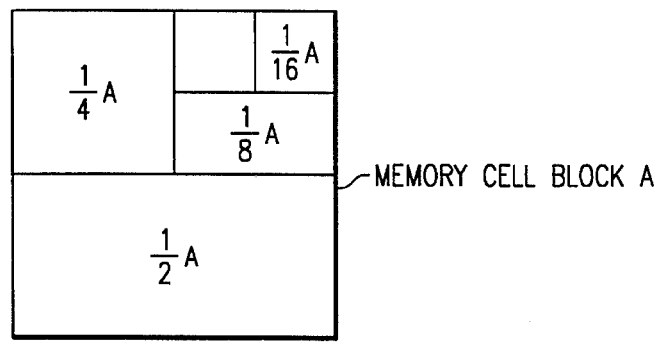
FIG. 10 is a diagram which illustrates the probability of defect occurrences in the memory cell block A.
Figure 11:
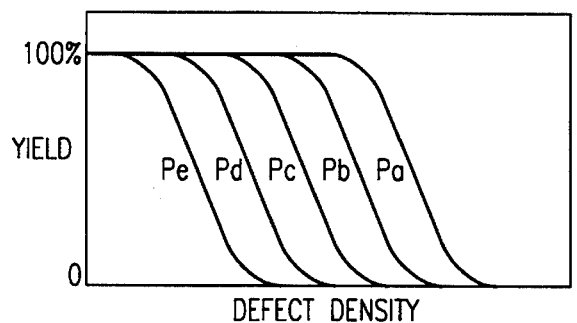
FIG. 11 is a graph which illustrates yield with respect to defect density in the examples a–e shown in FIG. 10.
Figure 12:
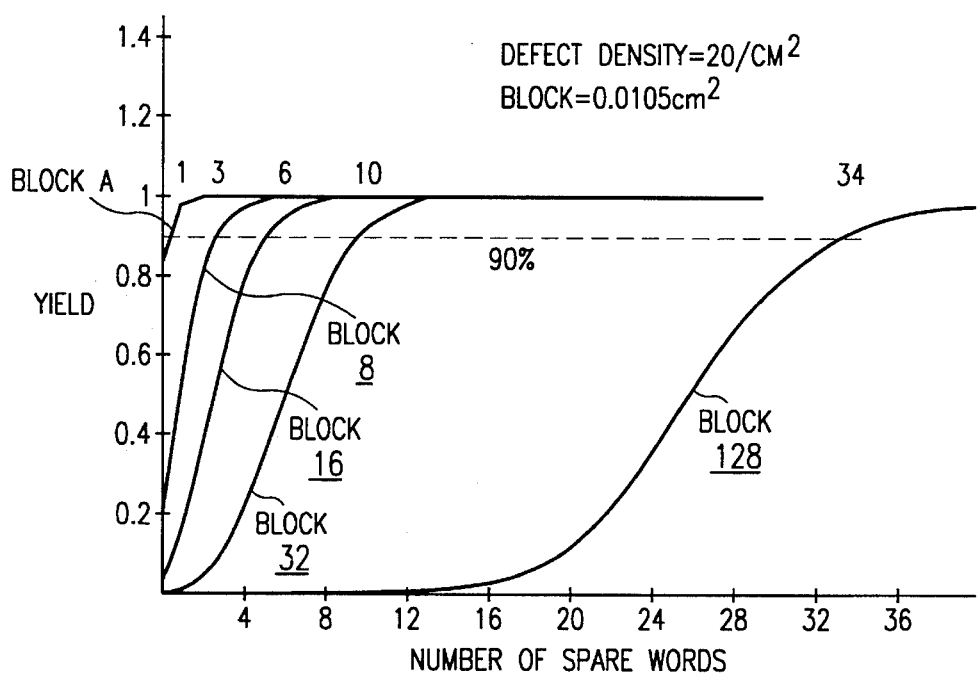
FIG. 12 is a graph which illustrates the calculation results for a case in which $1-Q(n)$ is taken as row yield.

As will be described with reference to FIGS. 10–12, since the value m×(64 MB/8 MB) increases beyond n, in the first embodiment, the fuse sets can simultaneously select a number of spare word sets for use in repairing word lines having defects, as shown in FIGS. 7(a) and 7(b).

However, essentially, the yield of the maximum application range is:

$$P_{8(m)} = \left( \sum_{n=0}^{m} (A_{8MEG}D)^n e^{-(A8MEGD)}/n! \right) \quad \text{(Formula 10)}$$

Thus, it drops to:

$$P_{8(m)}' = \left( \sum_{n=0}^{m} (K A_{8MEG}D)^n e^{-(KA8MEGD)}/n! \right) \quad \text{(Formula 11)}$$

(where K is the number of spare word bits to be repaired at the same time).

For this reason, when the number m is increased beyond the ideal value, the aforementioned problem of increased chip area arises. In contrast, when the ideal m value is used with the second embodiment, high efficiency and redundancy over the minimum area are obtained.

This will be explained using a simple example.

In this case, a 16 MB DRAM, with a memory cell area of 0.32 cm², has a maximum application range (based on the ideas presented in the first embodiment) of 8 MB, due to the limitations of the refresh cycle. The defect density D during the corresponding manufacturing processes is 20/cm².

The yield $P_{a(x)}$, which is determined according to the number of fuse sets in the entire chip (16 M·$A_{16}$ blocks), is expressed in the following formula. The value of x at which $P_{a(x)}$ exceeds 90% is 11.

$$P_{a(x)} = \sum_{n=1}^{X} (A_{16} D)^n e^{-(A16D)}/n! \quad \text{(Formula 12)}$$

Next, the yield $P_{b(y)}$, which is determined according to the number of fuse sets corresponding to an 8-M block ($A_8$), is expressed in the following formula. The value of y at which $P_{b(y)}$ exceeds 90% is 7.

$$P_{b(y)} = \left( \sum_{n=0}^{Y} (A_8 D)^n e^{-(A8D)}/n! \right)^2 \quad \text{(Formula 13)}$$

Next, if the spare word sets contain single groups of four lines, with the driver areas of the spare word lines set in the same layout as the driver areas of the normal word lines, then the least significant bit block in the 8 MB will be 2-M block ($A_2$). In addition, the yield $P_{c(z)}$, which is determined according to the number of spare word sets, is expressed in the following formula. The value of z at which $P_{c(z)}$ exceeds 90% is 4.

$$P_{c(z)} = \left( \sum_{n=0}^{Z} (A_2 D)^n e^{-(A2D)}/n! \right)^8 \quad \text{(Formula 14)}$$

It is possible to obtain a yield of 90% by fulfilling the above three conditions.

This is summarized as follows:

Number of fuse sets on the chip: 11 or more

Number of fuse sets corresponding to an 8-M block: 7 or more

Number of spare word sets corresponding to an 8-M block: 4 or more

In order to fulfill the above three conditions, the first embodiment is set as shown in FIGS. 7(a) and 7(b):

In FIG. 7(a), the number of fuse sets on the chip is set to 14,

In FIG. 7(b), the number of spare word sets in an 8-M block is set to 5, etc. Thus, the chip surface area is likely to be increased. In FIGS. 7(a) and 7(b), the fuse set FS has the same circuit structures as the fuse circuits shown in FIGS. 2(a), 2(b), and 2(c).

In FIG. 7(b), the reason the number of spare word sets is 5, is that in order to repair two lines at the same time, the least significant bit block is doubled. $P'_{c(z)}$ is expressed in the following formula. The value of z at which $P'_{c(z)}$ exceeds 90% is 5.

$$P_{c(2)}' = \left( \sum_{n=0}^{Z} (A_4 D)^n e^{-(A_4 D)}/n! \right)^4 \quad \text{(Formula 15)}$$

Figures 8, 9:
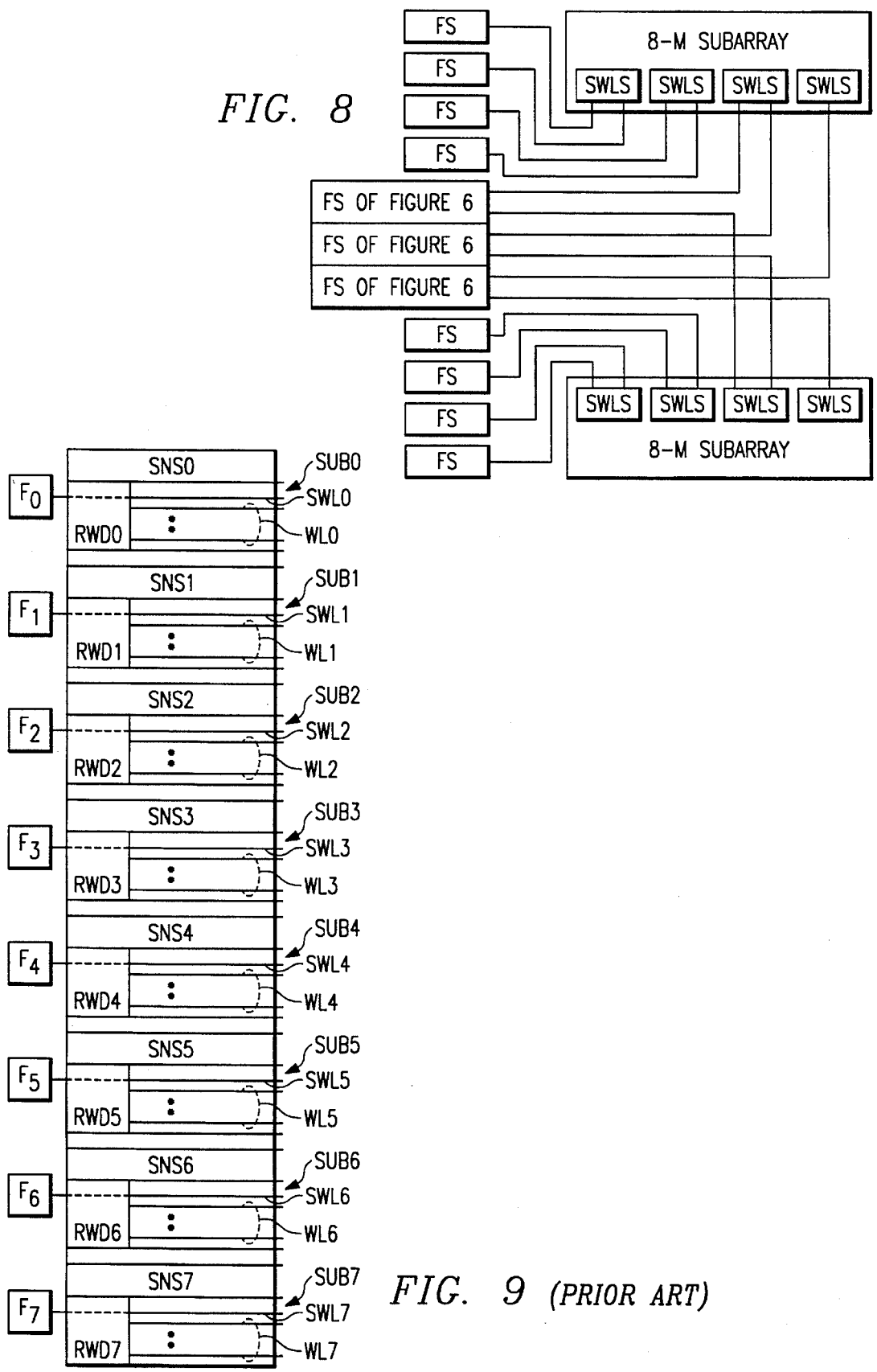
FIG. 8 is an explanatory diagram of the second application of the present invention.
FIG. 9 is a diagram which illustrates the basic concepts behind the redundant circuitry architecture used with conventional highly integrated semiconductor memory devices.

In this case, when fuse sets with a circuit structure such as that shown in FIG. 6 are used in forming a system such as that shown in FIG. 8, it is possible to solve the above problems.

In the first and second embodiments of the present invention, defective memory cells are repaired using spare word lines. In addition, it is also possible to repair the defective memory cells by installing spare bit lines in the bit line direction. In addition, it is also possible to form a single group of spare word (bit) lines, set outside the subarrays, in order to obtain a structure in which no spare memory is contained in the subarrays. In addition to the above, the present invention can be altered in a variety of ways, based on its technical ideas.

As described above, with the present invention, when a defect occurs in a certain subarray, it can be repaired using the spare sets contained in that subarray, in addition to which, it can be repaired using the spare sets of other subarrays. Thus, it provides better repairing efficiency and better yield during manufacturing than conventional systems.

In addition, since it is possible to use any of the fuse sets in selecting the subarray which is to be the output destination of the output signals, multiple correspondences (any-to-any correspondence) are formed between the fuse sets and the subarrays using redundancy, thereby further improving the efficiency of the repairing operation, and improving yield.

I claim:

1. A semiconductor memory device comprising:

an array of memory cells made up of a plurality of subarrays of memory cells;

each of said subarrays of memory cells being arranged in a matrix of rows and columns of individual memory cells;

spare sets of redundant memory cells corresponding to at least some of said subarrays of memory cells;

address generating means for providing an address signal to selectively drive one of the row and column of memory cells included in a subarray of memory cells;

sets of short circuit elements for selecting a spare set of redundant memory cells from any one of the spare sets of redundant memory cells regardless of which subarray of memory cells corresponds thereto instead of the selected one of the row and column of memory cells included in a subarray of memory cells when said selected one of the row and column of memory cells included in the subarray of memory cells contains at least one defective memory cell;

redundancy enable generating means responsive to the detection of an address corresponding to a defective memory cell for producing a redundancy enable signal; and sets of spare drivers corresponding to said spare sets of redundant memory cells, a respective set of spare drivers responsive to a redundancy enable signal from said redundancy enable generating means for selectively driving a spare set of redundant memory cells in accordance with a selection status of said sets of short circuit elements.

2. A semiconductor memory device as set forth in claim 1, wherein said spare sets of redundant memory cells include a respective spare set of redundant memory cells corresponding to each of said subarrays of memory cells.

3. A semiconductor memory device as set forth in claim 1, wherein said address generating means includes first and second address decoders for providing first and second address signals in order to selectively drive said one of the row and column of memory cells included in a subarray of memory cells;

said set of spare drivers being responsive to a redundancy enable signal from said redundancy enable generating means and one of said first and second address signals for selectively driving a spare set of redundant memory cells in accordance with the selection status of said sets of short circuit elements.

4. A semiconductor memory device as set forth in claim 1, wherein said address generating means provides an address signal to selectively drive a row of memory cells included in a subarray of memory cells.

5. A semiconductor memory device as set forth in claim 1, wherein each of said sets of short circuit elements is a fuse set comprising a plurality of fuse circuits, each of said fuse circuits being subject to being blown or not blown in dependence upon the occurrence of at least one defective memory cell or the lack of a defective memory cell in the subarray of memory cells corresponding to the respective fuse circuit.

6. A semiconductor memory device as set forth in claim 5, wherein each of said fuse sets contains a plurality of different fuse circuits, said plurality of different fuse circuits including a first fuse circuit operable to select any one of the spare sets of redundant memory cells to be substituted for the selected one of the row and column of memory cells included in a subarray of memory cells when said selected one of the row and column of memory cells included in the subarray of memory cells contains at least one defective memory cell;

a second fuse circuit being operable to select spare sets of redundant memory cells when defective memory cells are detected in multiple neighboring locations; and a third fuse circuit operable in conjunction with the first and/or the second fuse circuit for controlling the selection of the spare sets of redundant memory cells.

7. A semiconductor memory device as set forth in claim 1, wherein said sets of short circuit elements correspond in number to said spare sets of redundant memory cells, one set of short circuit elements and one spare set of redundant memory cells being provided for each of said subarrays of memory cells.

8. A semiconductor memory device as set forth in claim 1, wherein each set of short circuit elements may correspond to any one of said subarrays of memory cells utilizing spare sets of redundant memory cells.

9. A semiconductor memory device as set forth in claim 8, wherein the number of said sets of short circuit elements is determined according to the defect density D per word line as expressed by $$P_{F(n)} = \sum_{n=0}^{n_F} \frac{(AD)^n e^{-(AD)}}{n!}$$

where $P_{F(n)}$ is the manufacturing yield based on the Poisson distribution function, n=the number of defects in the memory cell area A of the plurality of subarrays of memory cells, and $n_F$=the number of sets of short circuit elements for the plurality of subarrays of memory cells.

* * * * *